United States Patent
Luconi et al.

(10) Patent No.: US 7,905,227 B2
(45) Date of Patent: Mar. 15, 2011

(54) SELF-BALLASTING SOLAR COLLECTOR

(75) Inventors: Gregg Frederick Luconi, Pasadena, CA (US); Kevin Hickerson, Altadena, CA (US)

(73) Assignee: Energy Innovations, Inc., Poway, CA (US)

( * ) Notice: Subject to any disclaimer, the term of this patent is extended or adjusted under 35 U.S.C. 154(b) by 1628 days.

(21) Appl. No.: 11/042,031

(22) Filed: Jan. 24, 2005

(65) Prior Publication Data

US 2005/0229924 A1 Oct. 20, 2005

Related U.S. Application Data

(60) Provisional application No. 60/612,592, filed on Sep. 22, 2004, provisional application No. 60/557,738, filed on Mar. 30, 2004.

(51) Int. Cl.
*G02B 5/08* (2006.01)
*F24J 2/52* (2006.01)

(52) U.S. Cl. ......... 126/696; 126/684; 126/623; 126/906; 126/438; 248/205.1; 350/299; 350/292

(58) Field of Classification Search .................. 126/696, 126/684, 623, 906; 248/125.8, 188.6, 188.7, 248/250.1; 350/299, 292
See application file for complete search history.

(56) References Cited

U.S. PATENT DOCUMENTS

| | | | |
|---|---|---|---|
| 1,049,159 A | 12/1912 | Simmel | |
| 1,667,256 A | 4/1928 | Herrschaft | |
| 2,625,930 A | 1/1953 | Harris | |
| 2,709,318 A | 5/1955 | Benjamin | |
| 2,715,537 A | 8/1955 | Hofheimer | |
| 2,722,772 A | 11/1955 | Steanes | |
| 2,868,568 A | 1/1959 | Frye | |
| 3,323,833 A | 6/1967 | Kasparian | |
| 3,466,119 A * | 9/1969 | Giovanni | 359/851 |
| 3,507,526 A | 4/1970 | Walker et al. | |
| 3,734,301 A | 5/1973 | Rastocny | |
| 3,929,230 A | 12/1975 | Luthi | |
| 4,004,574 A | 1/1977 | Bar | |
| 4,036,462 A * | 7/1977 | Sheftel | 248/166 |

(Continued)

OTHER PUBLICATIONS

Endecon Engineering, Inc. Making Renewables Part of an Affordable and Diverse Electric System in California. Initial Characterization Report for 2nd System: R.W.E. Schott Solar Sunroof FS 20kW PV System[online], May 2004 [retrieved on Feb. 28, 2005]. Retrieved from the Internet; <URL:http://www.pierminigrid.org/FinalDeliverables/Project32/Task3.2.2a(4)_CharacterizationReport2ndSystem.pdf>.

(Continued)

*Primary Examiner* — Carl D Price
*Assistant Examiner* — Nikhil Mashruwala
(74) *Attorney, Agent, or Firm* — Knobbe Martens Olson & Bear, LLP

(57) ABSTRACT

A non-penetrating, roof-mounted, solar energy concentrator is disclosed. The invention in the preferred embodiment includes a receiver adapted to convert light into electricity; one or more reflectors adapted to direct solar light to the receiver; and a frame affixed to the receiver and one or more reflectors. The frame includes a plurality of footings adapted to frictional affix the frame to a roof, such that the concentrator is detachably secured to the roof with compromising the integrity of the roof. The footings may include or receive ballast used to increase the weight of the concentrator, thereby increasing the friction used to affix the concentrator to the roof without fasteners that penetrate the roof. The footings in some embodiments are also configured to deflect the wind, thereby reducing the wind load on the concentrator.

19 Claims, 20 Drawing Sheets

U.S. PATENT DOCUMENTS

| | | | |
|---|---|---|---|
| 4,071,017 A | | 1/1978 | Russell, Jr. et al. |
| 4,088,120 A | | 5/1978 | Anderson |
| 4,102,326 A | | 7/1978 | Sommer |
| 4,110,010 A | * | 8/1978 | Hilton ............................ 359/853 |
| 4,149,523 A | | 4/1979 | Boy-Marcotte et al. |
| 4,205,657 A | | 6/1980 | Kelly |
| 4,243,018 A | | 1/1981 | Hubbard |
| 4,307,709 A | | 12/1981 | Sletten et al. |
| 4,309,984 A | | 1/1982 | Dorbeck |
| 4,395,581 A | * | 7/1983 | Girard ............................ 359/853 |
| 4,413,618 A | | 11/1983 | Pitts et al. |
| 4,492,424 A | | 1/1985 | Clegg |
| 4,587,951 A | | 5/1986 | Townsend et al. |
| 4,602,613 A | | 7/1986 | Barr |
| 4,838,003 A | | 6/1989 | Zeigler |
| 4,999,059 A | * | 3/1991 | Bagno ............................ 136/248 |
| 5,013,176 A | | 5/1991 | Orbom |
| 5,049,105 A | | 9/1991 | Glickman |
| 5,121,526 A | | 6/1992 | Burkard et al. |
| 5,127,759 A | | 7/1992 | Orbom |
| 5,161,768 A | * | 11/1992 | Sarabin ......................... 248/525 |
| D357,544 S | | 4/1995 | Spransy |
| 5,564,411 A | | 10/1996 | Myles, III et al. |
| 6,032,430 A | | 3/2000 | Soukup |
| 6,061,978 A | | 5/2000 | Dinwoodie et al. |
| 6,148,570 A | | 11/2000 | Dinwoodie et al. |
| 6,465,724 B1 | * | 10/2002 | Garvison et al. ............... 136/244 |
| 6,495,750 B1 | | 12/2002 | Dinwoodie |
| 6,501,013 B1 | | 12/2002 | Dinwoodie |
| 6,570,084 B2 | | 5/2003 | Dinwoodie |
| 6,766,166 B1 | * | 7/2004 | Draim ........................... 455/430 |
| 7,156,088 B2 | * | 1/2007 | Luconi .......................... 126/696 |
| 7,192,146 B2 | * | 3/2007 | Gross et al. .................... 359/853 |
| 2003/0010372 A1 | | 1/2003 | Dinwoodie |
| 2003/0010374 A1 | | 1/2003 | Dinwoodie |
| 2003/0089049 A1 | * | 5/2003 | Scissom et al. ............... 52/126.1 |
| 2003/0164187 A1 | | 9/2003 | Dinwoodie |

OTHER PUBLICATIONS

Vacuum Solar Collectors. Datasheet [online].Watt Systemy Solarne. [retrieved on May 2, 2005]. Retrieved from the Internet:<URL:http;/www.kolektory.pl/index.php?action=oferta&show=2.1.3 &lang=en>.

DayStar Signature Systems. Datasheet [online]. Cascade Sun Works, Inc.[retrieved on Jul. 5, 2005]. Retrieved from the Internet:<URL:http:www.sun-works.com/products/Thermal/solar_hotwater.html>.

Cascade Sun Works Current Projects Bend, Oregon. Datasheet [online].Cascade Sun Works . [retrieved on Jul. 5, 2005]. Retrieved from the Internet: <URL:http:www.sun-works.com/current_projects/2E0901/2E0901.html>.

Non-final Office Action mailed Dec. 16, 2010 in U.S. Appl. No. 11/644,643.

Allowed claims in U.S. Appl. No. 11/644,643, allowed on Jun. 28, 2010.

* cited by examiner

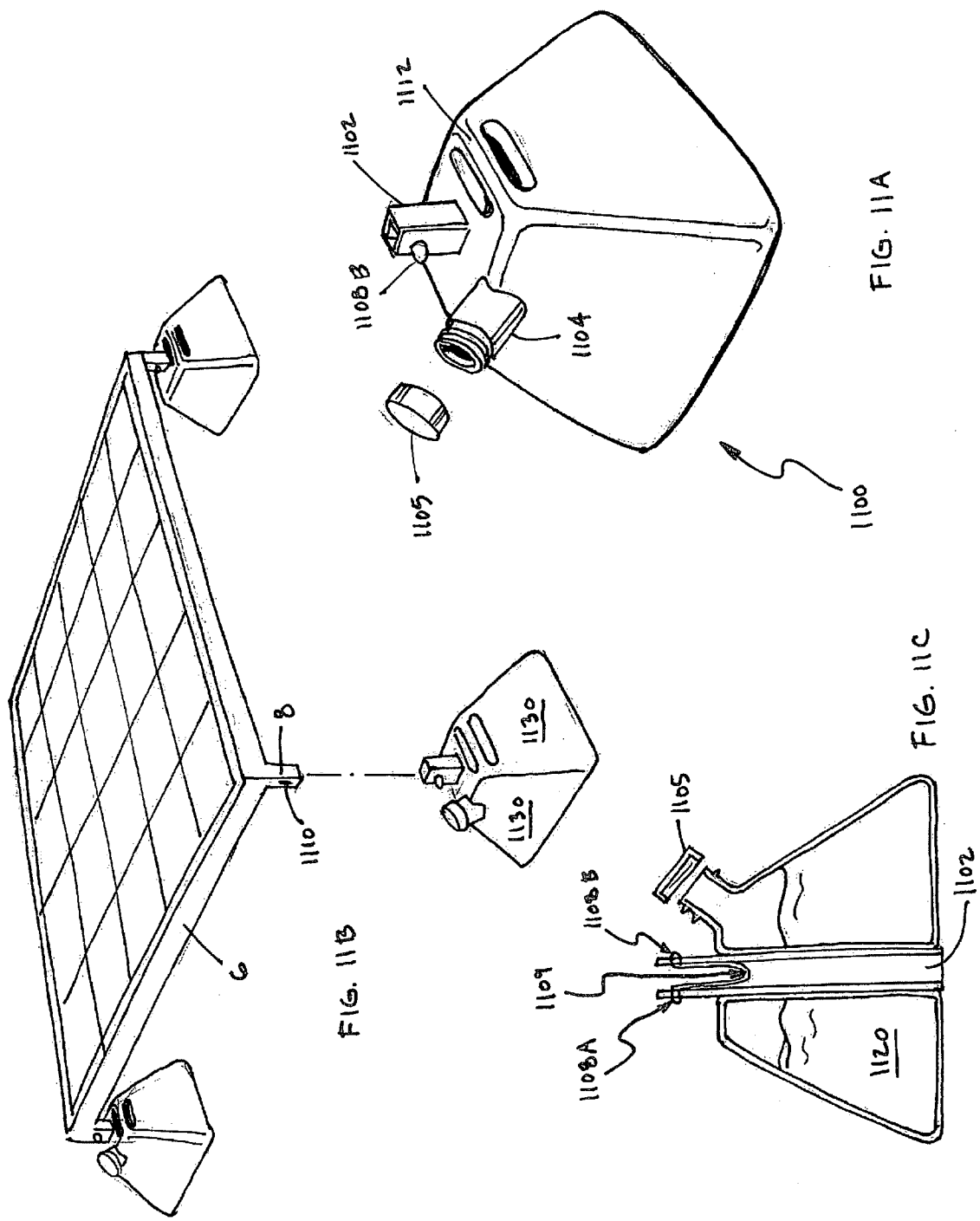

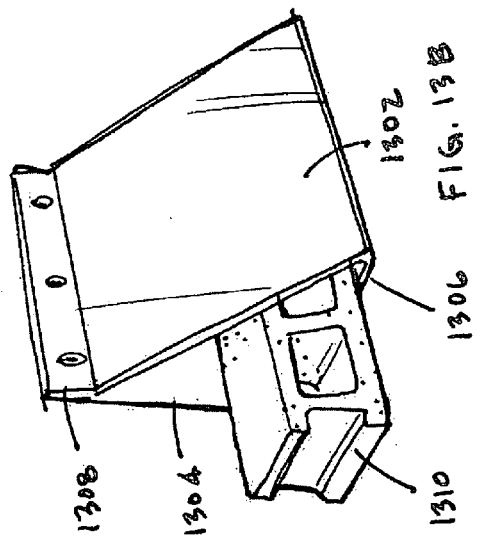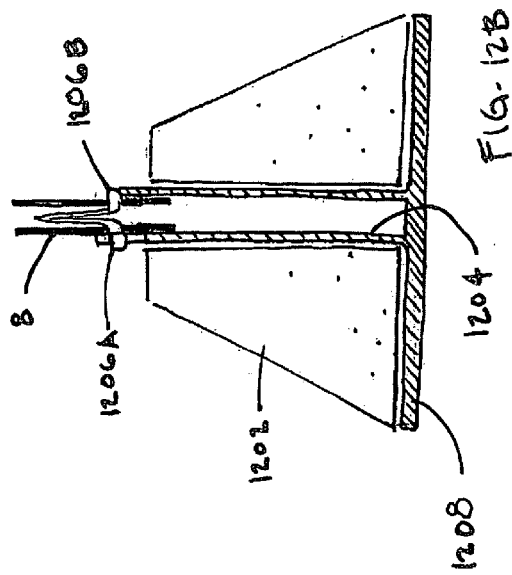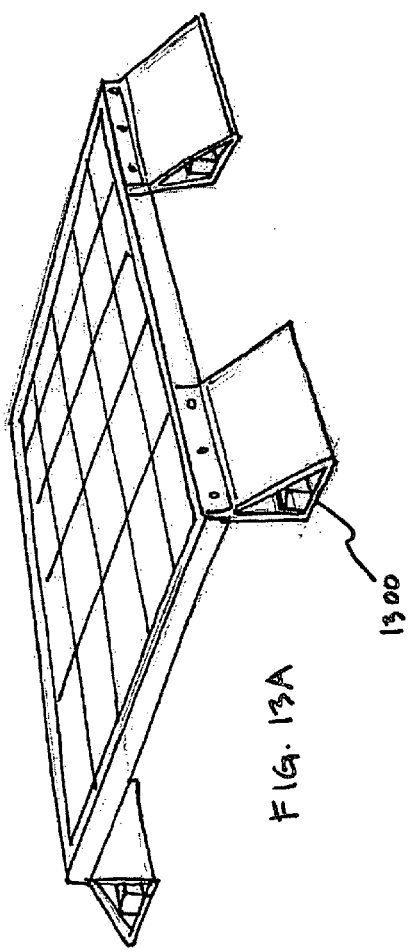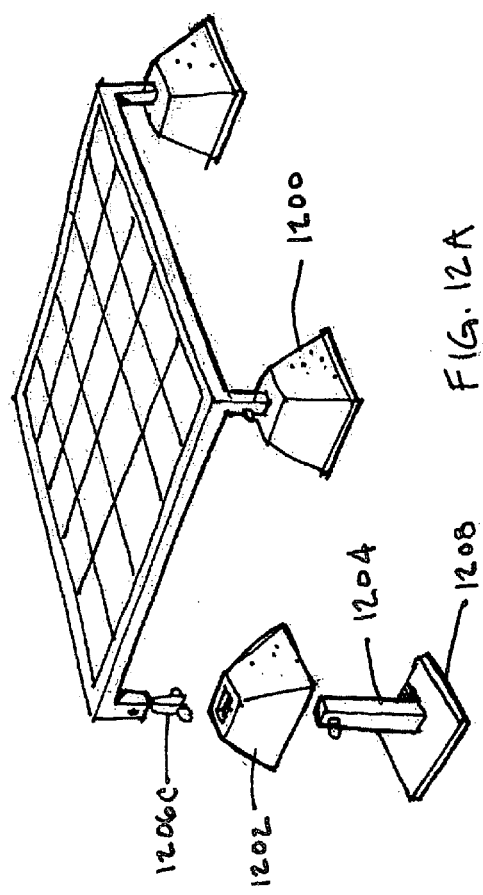

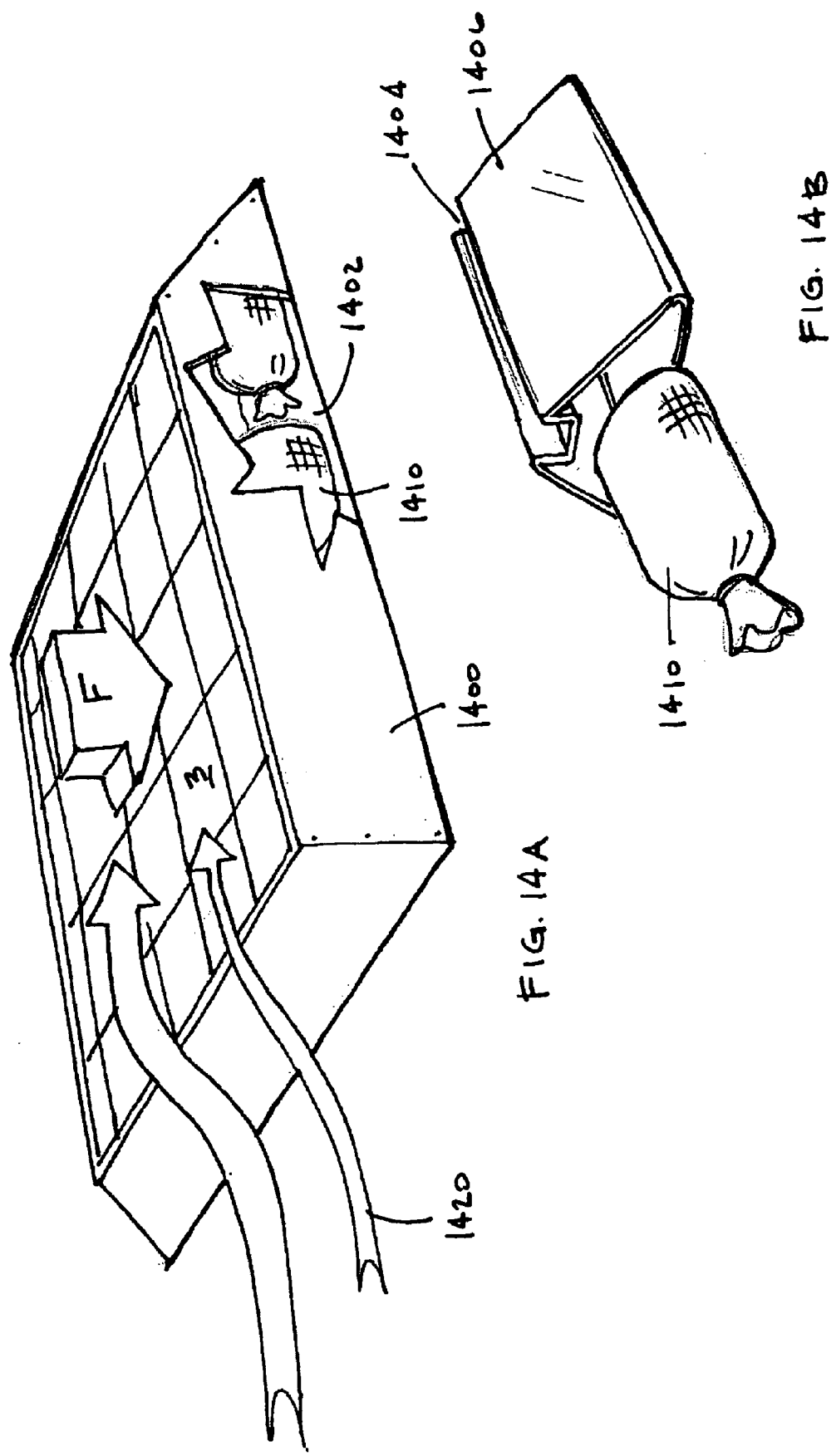

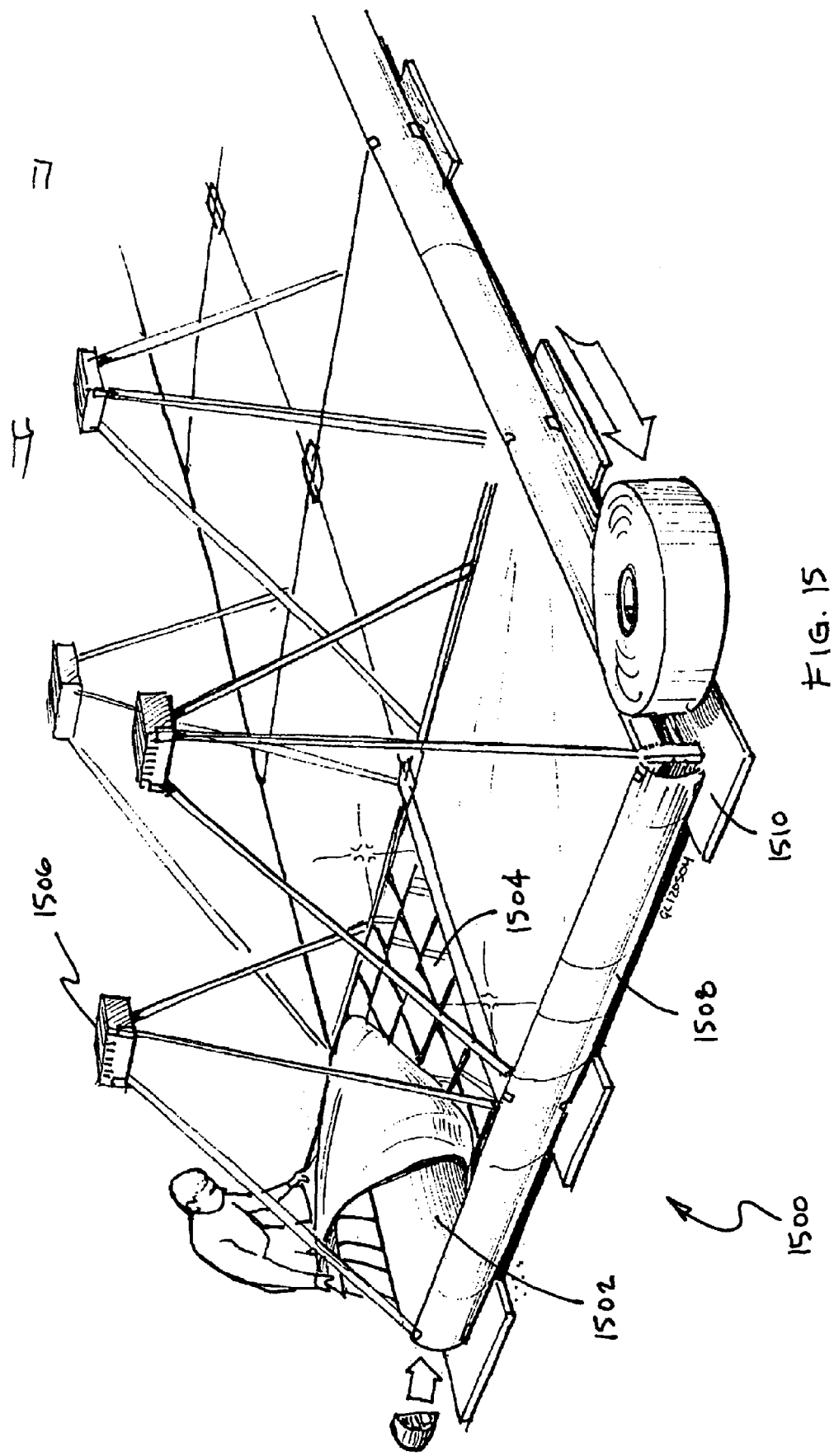

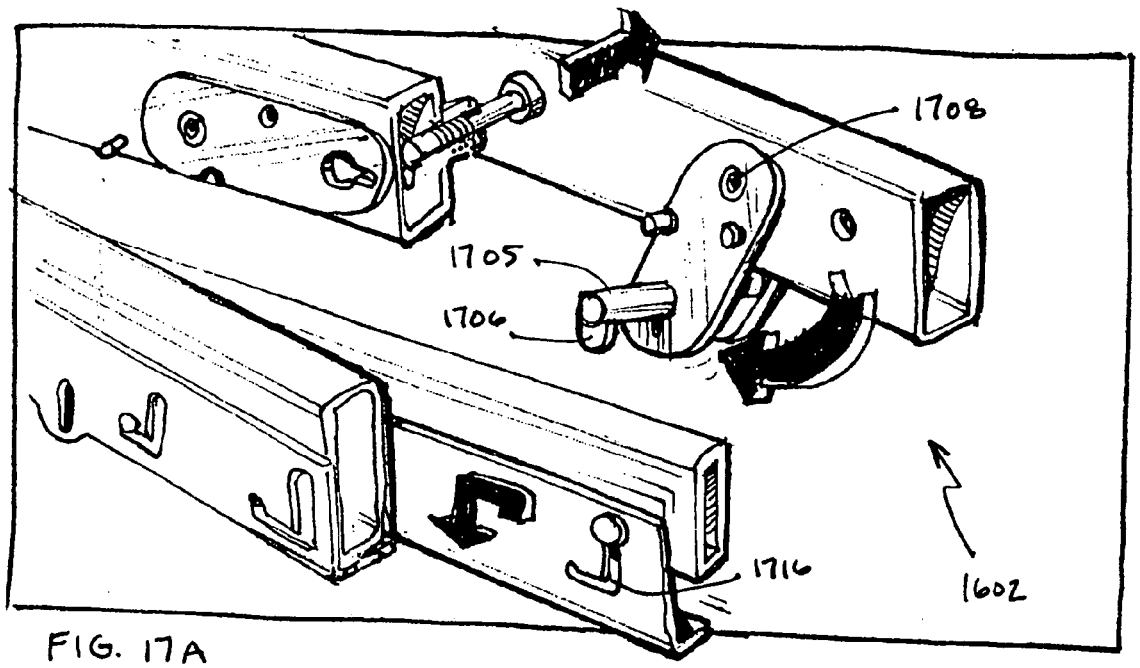
FIG. 17A
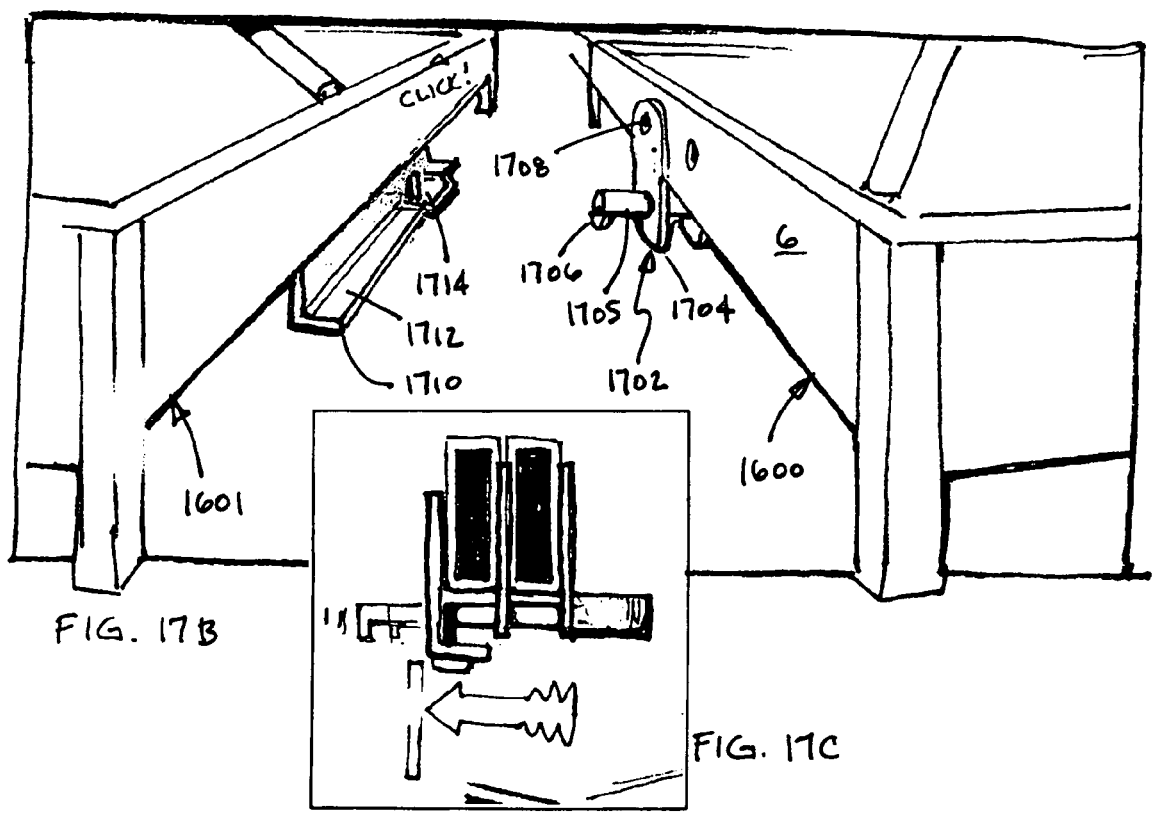
FIG. 17B
FIG. 17C

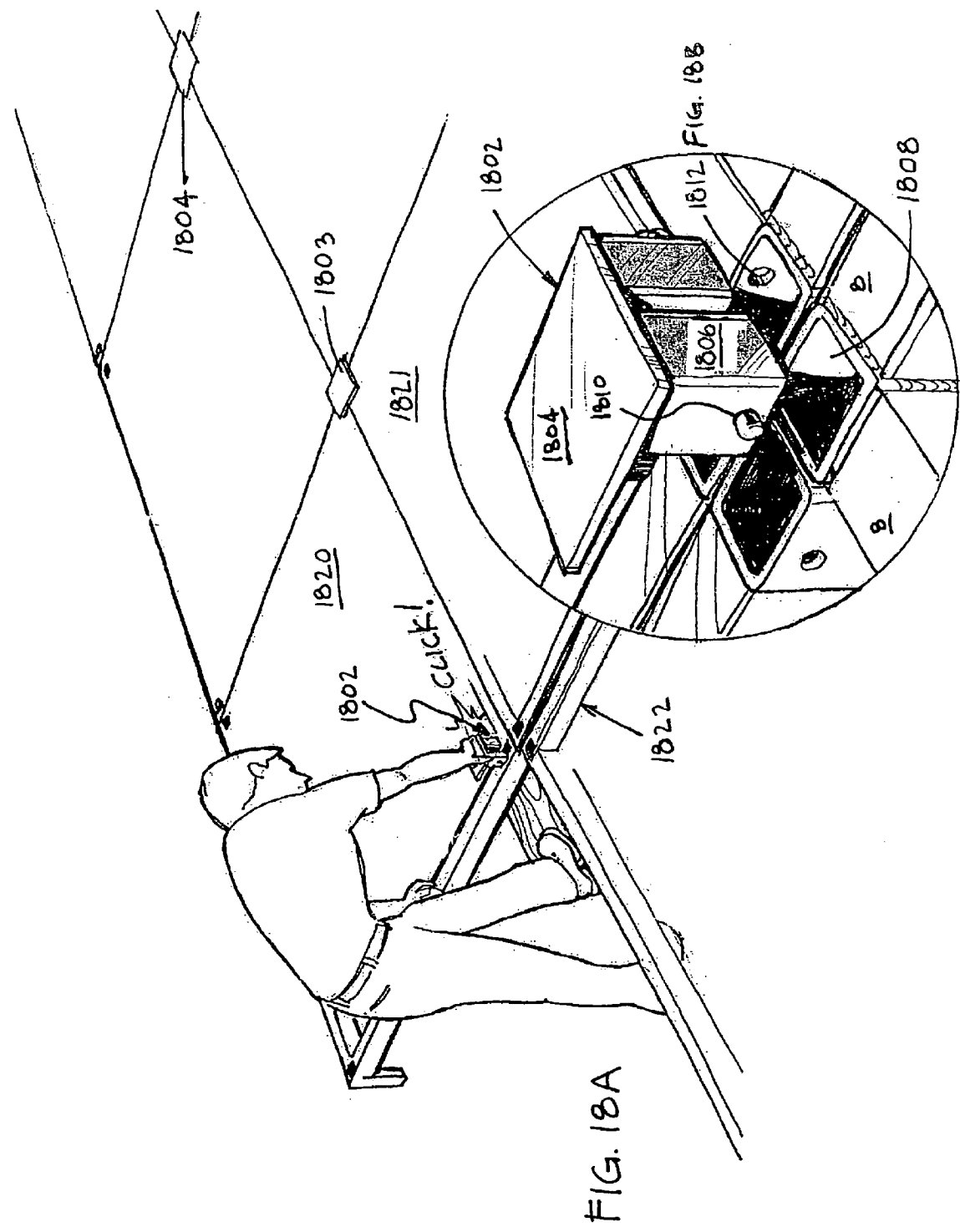

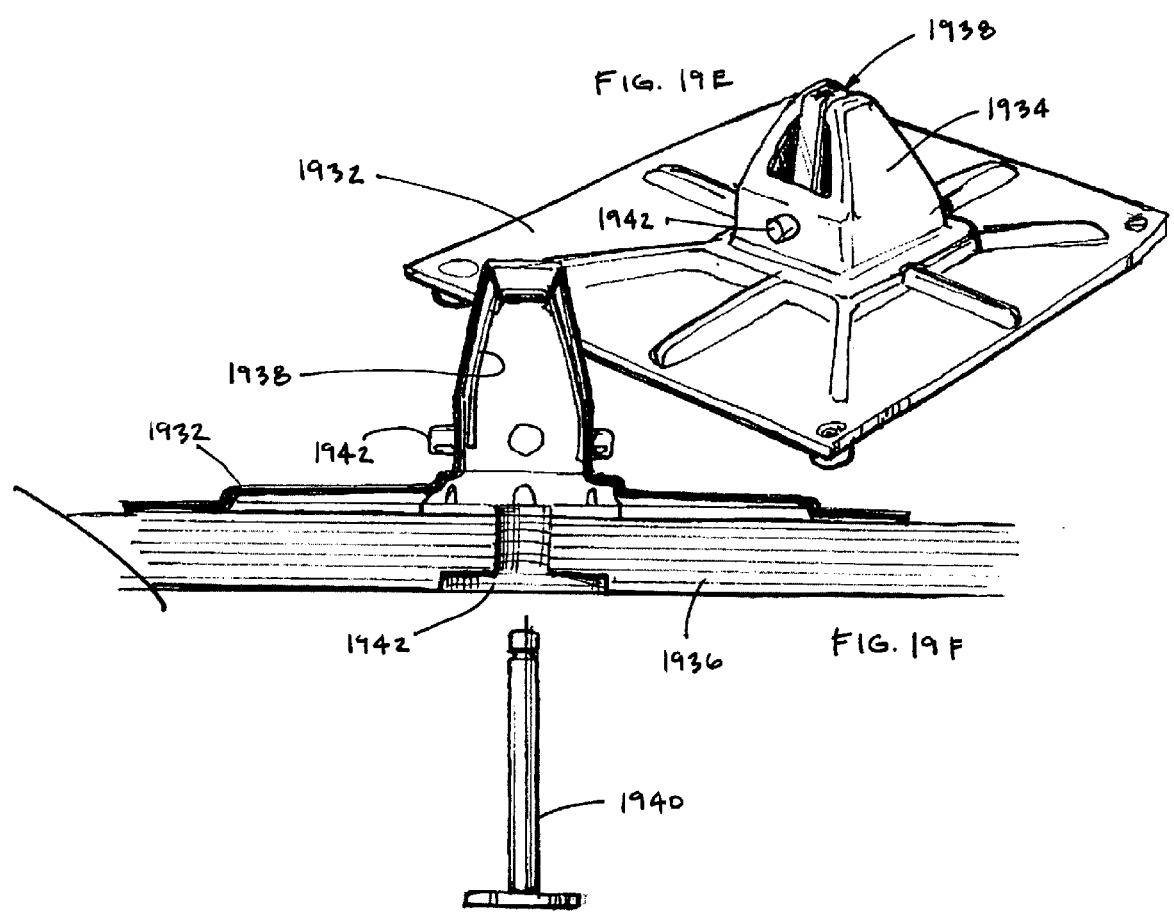

SELF-BALLASTING SOLAR COLLECTOR

CROSS-REFERENCE TO RELATED APPLICATION

This application claims the benefit of U.S. Provisional Patent Application Ser. No. 60/612,592 filed Sep. 22, 2004, entitled "APPARATUS FOR REDIRECTING PARALLEL RAYS USING SIMPLE RIGID TRANSLATION," and of U.S. Provisional Patent Application Ser. No. 60/557,738 filed Mar. 30, 2004, entitled NON-PENETRATING ROOF-MOUNTED TRACKING SOLAR COLLECTOR," both of which are hereby incorporated by reference herein for all purposes.

FIELD OF INVENTION

The invention generally relates to a solar energy concentrator adapted for roof-mounted installation. In particular, the invention relates to a system for frictionally affixing a concentrator on a roof without roof penetrations and the associated damage caused therefrom.

BACKGROUND

Tracking solar systems have been built and refined for many years. These systems, however, generally require firm mounting into the ground which often entails drilling deep holes then filled with concrete to support the system. These measures are often required since the wind load on a system goes up as the square of the wind speed. In some systems, the wind load may produce lateral forces that push the system in the direction co-parallel to the wind as well lifting forces that can pull a system upwardly. These wind loads are generally high enough to necessitate that the system by physically anchored to the roof to prevent the system from being blown away. Mounting a unit with anchors into the roof is typically unacceptable because holes in the roof may cause leaks and make it difficult if not impossible to re-roof. There is therefore a need for a solar system adapted to remain fixed on a roof without the need to be physically anchored to the roof with fasteners that penetrate the roof.

SUMMARY

The invention features a non-penetrating, roof-mounted, solar energy concentrator designed be placed on a roof while minimizing damage to the roof that is prevalent with prior art concentrators. The invention in the preferred embodiment includes a receiver adapted to convert light into electricity; one or more reflectors adapted to direct solar light to the receiver; and a frame affixed to the receiver and one or more reflectors. The frame includes a plurality of footings adapted to frictional affix the frame to a roof, such that the concentrator is detachably secured to the roof with compromising the integrity of the roof.

The receiver is preferably a photovoltaic cell and the one or more reflectors include an array of mirrors. The concentrator, including the receiver and mirrors, in the preferred embodiment are in the form of a heliostat array. The heliostat array includes: (a) a positioning plate adapted to simultaneously aim each of the plurality of mirrors—each of which is adapted to rotate about a first center of rotation—in a direction bisecting the interior angle between the source and the receiver; and (2) a plurality of reflector positioning arms for operably coupling the plurality of reflectors to the positioning plate, each of the positioning arms being adapted to rotate relative to the positioning plate about a second center of rotation. A line segment between the first center of rotation and the second center of rotation for each of the plurality of positioning arms is substantially equal to a base of an isosceles triangle having a first leg aligned with a first ray from the source and the a second leg parallel to a second ray to the receiver, the first leg and second leg being equal length.

A footing in some embodiments includes a container adapted to retain ballast to increase the weight of the concentrator for purposes of increasing the friction between the concentrator and roof, thereby enabling the concentrator to reside on the roof without using fasteners that might otherwise penetrate the roof and expose the roof to damage. The ballast—which may be water, sand, or gravel, for example— may be easily filled or emptied to facilitate the installation and relocation of the concentrator. The container may even be shaped with one or more inclined exterior surfaces, for example, to deflect wind and induce a downward force on the concentrator.

A footing in some embodiments includes ballast—concrete, for example—anchored to the concentrator to increase the weight of the concentrator, thereby increasing the static friction between the footing and the roof. The ballast may be solid ballast—concrete, for example—etachably attached to the heliostat frame using a post and bottom plate. The ballast—in the form of sandbags or concrete blocks, for example—may be received by a cavity in a receptacle of the footing where it provides dead weight for the heliostat array. The ballast itself or the receptacle in which the ballast is inserted may include one or more exterior surface with an incline adapted to induce a downward force on the concentrator in the presence of wind.

A footing in some embodiments includes a bottom surface adapted to engage a trough that further distributes the weight of the concentrator across the roof on which it is installed. In addition to footings, the trough may be further adapted to receive and support electrical conduit that carry power and control cables, for example, between the given concentrator and other concentrators operably coupled in an assembly arrayed in one or two dimensions over a roof.

BRIEF DESCRIPTION OF THE FIGURES

FIG. 11A-11B are perspective views of a footing for frictionally affixing the heliostat to a roof, in accordance with a first embodiment of the footing;

FIG. 11C is a cross sectional view of a footing for frictionally affixing the heliostat to a roof, in accordance with the first embodiment of the footing;

FIGS. 12A-12B are perspective views of a footing for frictionally affixing the heliostat to a roof, in accordance with a second embodiment of the footing;

FIG. 13A is perspective view of a footing for frictionally affixing the heliostat to a roof, in accordance with a third embodiment of the footing;

FIG. 13B is a cross sectional view of a footing for frictionally affixing the heliostat to a roof, in accordance with the third embodiment of the footing;

FIG. 14A is perspective view of a footing for frictionally affixing the heliostat to a roof, in accordance with a fourth embodiment of the footing;

FIG. 14B is a cross sectional view of a footing for frictionally affixing the heliostat to a roof, in accordance with the fourth embodiment of the footing;

FIG. 15 is a perspective view of a plurality of concentrators physically and operably coupled in a roof-mounted assembly, in accordance with a first embodiment of the assembly;

FIGS. 17A-17C are close up views of a plurality of heliostats being physically coupled, in accordance with an embodiment of the present invention;

FIGS. 18A-18B are perspective views of a coupling used to physically link a plurality of heliostats, in accordance with the first embodiment of the present invention;

DESCRIPTION OF THE PREFERRED EMBODIMENT

Figure 1:
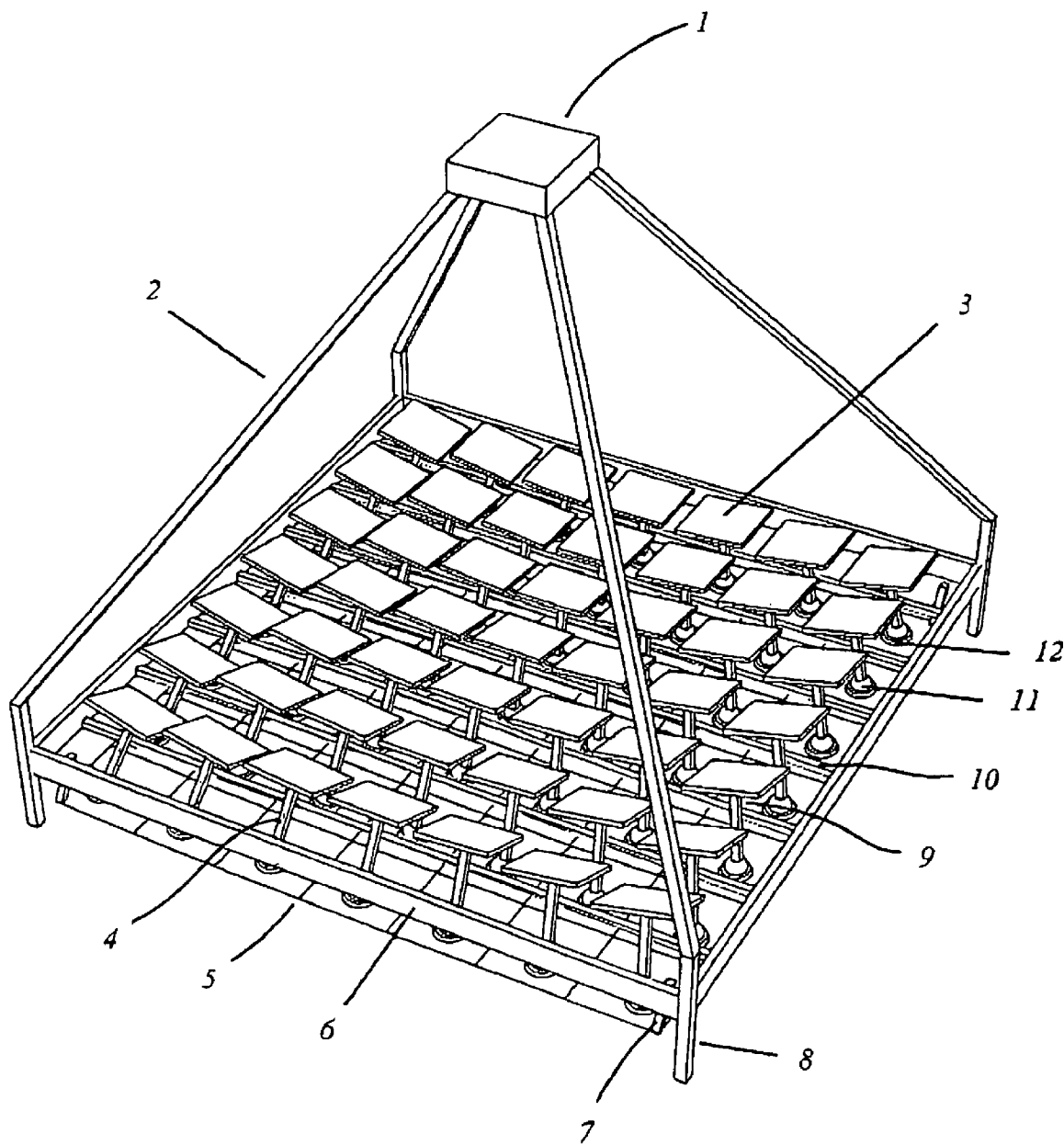
FIG. 1 is a perspective illustration of a heliostat that uses parallel motion of a rigid plate to position the mirrors simultaneously using simple parallel translation, in accordance with the preferred embodiment.

Illustrated in FIG. 1 is a solar concentrator or concentrator module in the form of a heliostat array comprising a plurality of reflectors and a positioning plate for simultaneously orienting the plurality of reflectors. The positioning plate is adapted to aim or otherwise orient each of the plurality of reflectors in a direction bisecting the interior angle between the source of the radiation and the receiver of the reflected radiation, thereby mapping between the parallel rays associated with a distant object and focused rays associated with the focus. In accordance with the preferred embodiment of the present invention, the positioning plate is a rigid plate with a contoured surface adapted to simultaneously orient each of the plurality of reflections while changing the direction of the parallel rays, i.e., their angles of incident, where the distant object is moving, for example. One skilled in the art will appreciate that the preferred embodiment of the present invention may be used to transmit radiation from a source to a distant object or to collect radiation from a distant object then direct to a common focal point. One skilled in the art will appreciate that the array may be adapted to reflect radiation from a wide portion of the electromagnetic spectrum.

In the preferred embodiment, the array is a linked heliostat array comprising a plurality of siderostats, a positioning plate operatively coupled to each of the plurality of siderostats, and a receiver incorporated into the receiver housing 1. The plurality of siderostats in cooperation with the positioning plate 5, are adapted to reflect the incident sunlight to a common focal point coinciding with a receiver (not shown) independently of the position of the sun. Each of the plurality of siderostats includes a combination reflector and a positioning arm rotatably attached to a heliostat chassis by means of an articulated mounting structure permitting the reflector to be steered under the control of the actuated positioning plate. The positioning plate 5 is generally characterized by a non-planar surface configured to orient each of the reflectors to reflect the sunlight to the same fixed focal point as the sun sweeps across the diurnal sky, for example. The positioning plate 5 is effectively geometrically encoded with the position of each reflector as a function of the receiver position and position of the reflector within the array.

In the preferred embodiment, the reflectors are mirrors 3 that reflect incident sunlight to the receiver housing 1 and the receiver therein. The position of the receiver and housing 1 are preferably fixed relative to the plurality of siderostats by means of receiver support arms 2. The receiver in the preferred embodiment includes a photovoltaic plate, associated electronics, and cooling system, although various other forms of energy converters may also be employed including thermal absorbing liquids, for example. In alternative embodiments, the receiver is selected from a group comprising a heat exchanger, heat engine, and turbine, for example.

The plurality of mirrors in the preferred embodiment are arrayed two dimensionally in a horizontal or incline plane and the mirrors adapted to rotated about two orthogonal axes. In other embodiments, the plurality of mirrors may be arrayed three dimensionally with suitable modification to the contour of the positioning plate 5. In the preferred embodiment, each of the siderostats is rotatably affixed to heliostat chassis which comprises a support frame 6, a plurality of supports 10 spanning the width of the chassis, and a plurality of stantions 9 atop the supports 10 for mounting the mirrors 3.

In the preferred embodiment, each of the mirrors 3 has mirror positioning arm 4 rigidly affixed to the back surface of the mirror 3. Each mirror positioning arm 4 is oriented perpendicularly to the associated mirror 3 at the point of contact at the center of the back surface. Each combination of mirror 3 and positioning arm 4 is rotatably coupled to the chassis by means of a primary articulated joint positioned at the proximal end of the positioning arm 4 in proximity to the point of attachment to the backside of the mirror 3. The distal end of the positioning arm 4, in turn, is rotatably coupled to the positioning plate 5 by means of a secondary articulated joint, preferably a ball joint or universal joint, that permits the positioning arm 4 to rotate as the positioning plate 5 is displaced via a rotational or translation motion. The secondary articulated joint may also permit the positioning arm 4 to slide in the direction of its longest axis, thereby enabling the positioning plate 5 to move closer to or further away from the associated mirror 3 as the positioning plate is displaced to account for movement of the sun.

Figure 2:
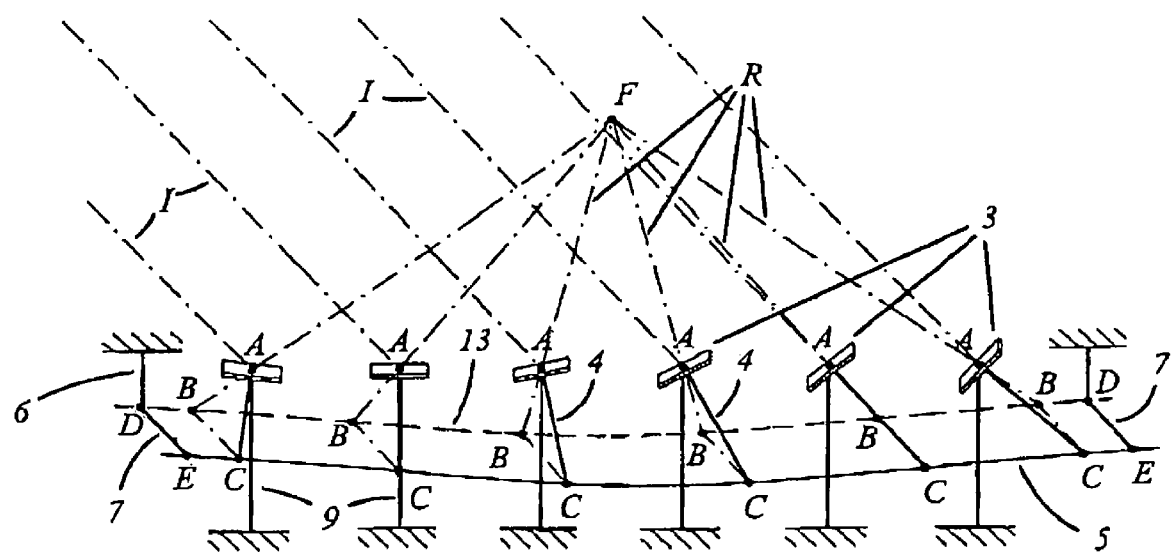
FIG. 2 is a schematic illustration of the heliostat, in accordance with the preferred embodiment.

Illustrated in FIG. 2 is a schematic view of the heliostat array including the receiver and a co-planar array of siderostats. As can be seen, the plurality of mirrors 3 are oriented so as to reflect the parallel incoming rays, I, and direct all reflected rays, R, to a common focal point, F, coinciding with the receiver. The orientation of the mirrors 3 is controlled by the positioning plate 5 via the positioning arms 4. The positioning arms 4 are schematically represented by the resultant line segments, AC, where each point A schematically represents the center of rotation of a mirror 3 and its associated positioning arms 4 relative to heliostat chassis. Each point C schematically represents the center of rotation of each positioning arm 4 relative to the positioning plate 5.

Each of the mirrors 3 rotates about its center of rotation at point A in response to the displacement of the positioning plate 5 which exerts a torque on the distal end of each positioning arms 4. In the preferred embodiment, the positioning plate 5 is mounted to the chassis by means of one or more linkages including swing arms 7. Each of the swing arms is rotatably attached to the chassis 6 means of first hinge D and rotatably attached to the positioning plate 5 by means of a second hinge E. The first hinges D and second hinges E are preferably ball joints or universal joints allowing the positioning plate 5 to swing about two orthogonal axes.

In accordance with the teachings of the preferred embodiment, the distance between the positioning plate 5 and each mirror 3 in a direction normal to the mirror is schematically illustrated by line segment AC. The length of the segment AC is selected to be the magnitude of a resultant vector equal to the sum of two vectors, i.e., a first vector and a second vector having the same magnitude. The first unit vector of the two vectors, coinciding with a ray schematically represented by the segment AB, points from an individual mirror 3 to the focal point F coinciding with the receiver. The point A therefore lies on the line segment FB, such that the segment AB is parallel to the reflected rays R. The second vector of the two component vectors points to the radiation source and is schematically represented by the segment BC. The length of the two component vectors are equal and thus form an isosceles triangle ABC with the sum vector spanning segment AB as the base.

The line segments BC are substantially parallel to one another for a distant radiation source. When the length of the swing arms 7 is made equal to the magnitude of the first and second vectors, each of the positioning arms 4 is adapted to coincide with the base of an isosceles triangle ABC for each siderostat for any orientation of the position plate 5. Thus, when the swing arms 7 are oriented parallel to the incident rays, each of the positioning rods 4—as defined by the distance between the first center of rotation A and the second center of rotation C—is oriented in a direction that bisects the interior angle between a source vector pointing to the sun and a receiver vector pointing from the associated mirror 3 to the focal point F.

If the plurality of mirrors 3 are co-planar, and all mirrors 3 share a common focal point F, the contour of the positioning plate 5 adapted to intersect each of the secondary centers of rotation, i.e., the points about which the positioning arms 4 rotate about the positioning plate 5, is given by the Conchoid of Nicomedes. For a two-dimensional array of mirrors 3, the shape of the positioning plate 5 is given by the Conchoid of Nicomedes surface of revolution represented in parametric form by:

$$\bar{x} = \left\{ u\left(1 + \frac{d}{r}\right), v\left(1 + \frac{d}{r}\right), -\frac{h}{r} \right\} \quad [1]$$

where u, v, are the position variables in a Cartesian coordinate system and $$r = \sqrt{u^2 v^2 + h^2}. \quad [2]$$

The variable h is the perpendicular distance of the focal point at point F from the plane that contains all the centers of rotation at represented by points A. The variable d is the length of the swing arm 7 which is substantially equal to the length of the segment AB. The axis about which the Conchoid of Nicomedes is revolved intersects the focal point F and is perpendicular to the plane defined by the primary centers of rotation, i.e., each point A.

One skilled in the art will appreciate that the positioning plate 5 having the shape of the Conchoid of Nicomedes surface of revolution permits the positioning plate to simultaneously point each of the mirrors such that the reflected rays R for each mirror 3 is directed to the same focus for any position of the sun. Moreover, all of the mirrors 3 may be simultaneously re-oriented to track the movement of the sun by simply swinging or otherwise rotating the positioning plate 5 such that the swing arms 7 are parallel with the incident rays I.

Figure 3:
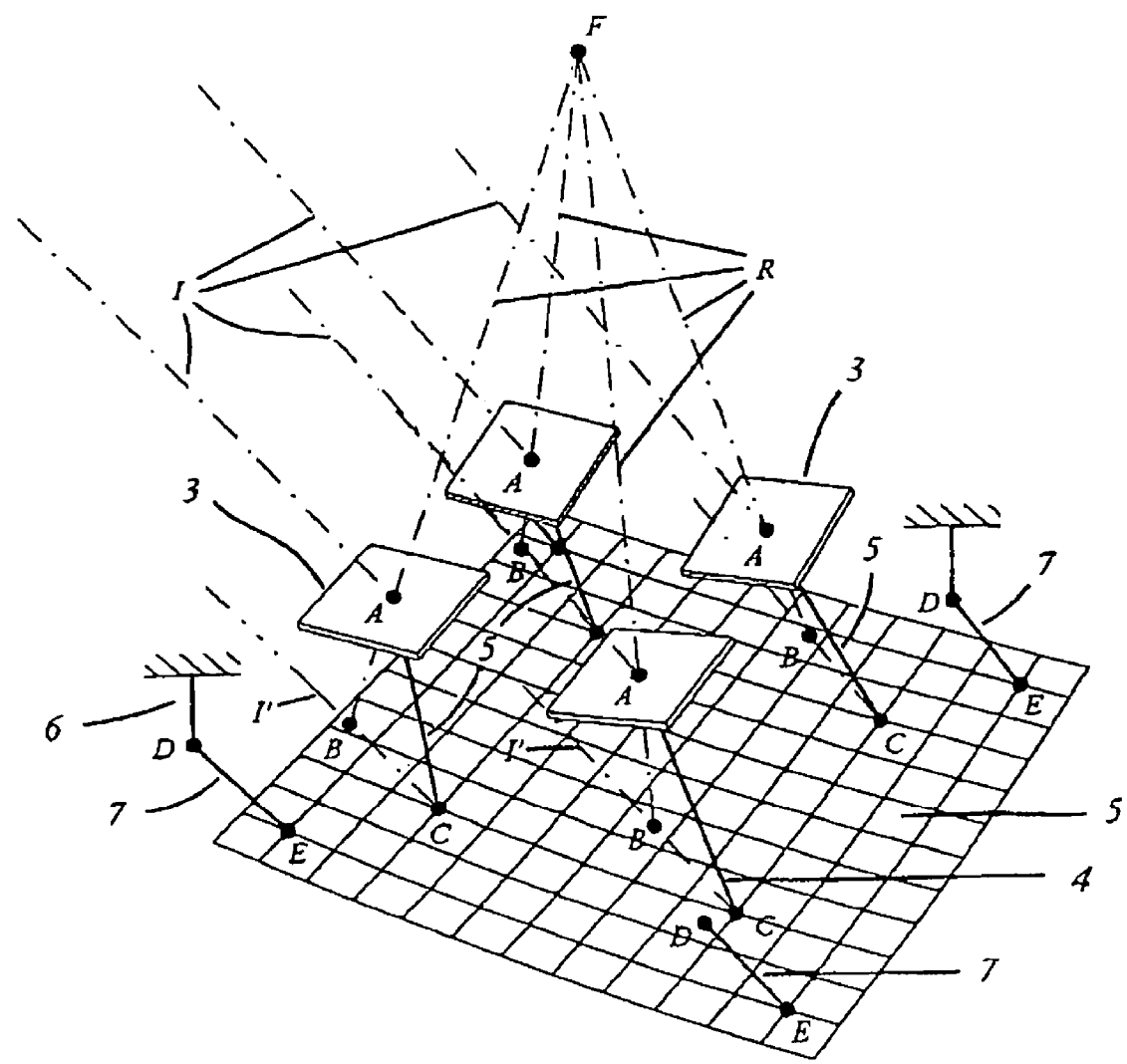
FIG. 3 is schematic perspective view of the heliostat, in accordance with the preferred embodiment.

Illustrated in FIG. 3 is an schematic perspective view of the heliostat array including a co-planar array of four siderostats adapted to reflect radiation between a distance source of incident radiation I and a receiver (not shown) at the focal point F. As in FIG. 2, each of the plurality of mirrors 3 is adapted to rotate about the primary center of rotation at point A in accordance with the movement of the positioning plate 5. The distance between each mirror 3 and the point of attachment of the associated positioning arm to the positioning plate is given by the vector sum of two component vectors, each of the vectors having a magnitude equal to the length of the swing arm 7 between its points of rotation schematically represent by points D and E. The first of the two component vectors coinciding with segment AB indicates the direction of the focal point relative to the mirror while the second component vector coinciding with segment BC indicates the direction of the source.

Figure 4:
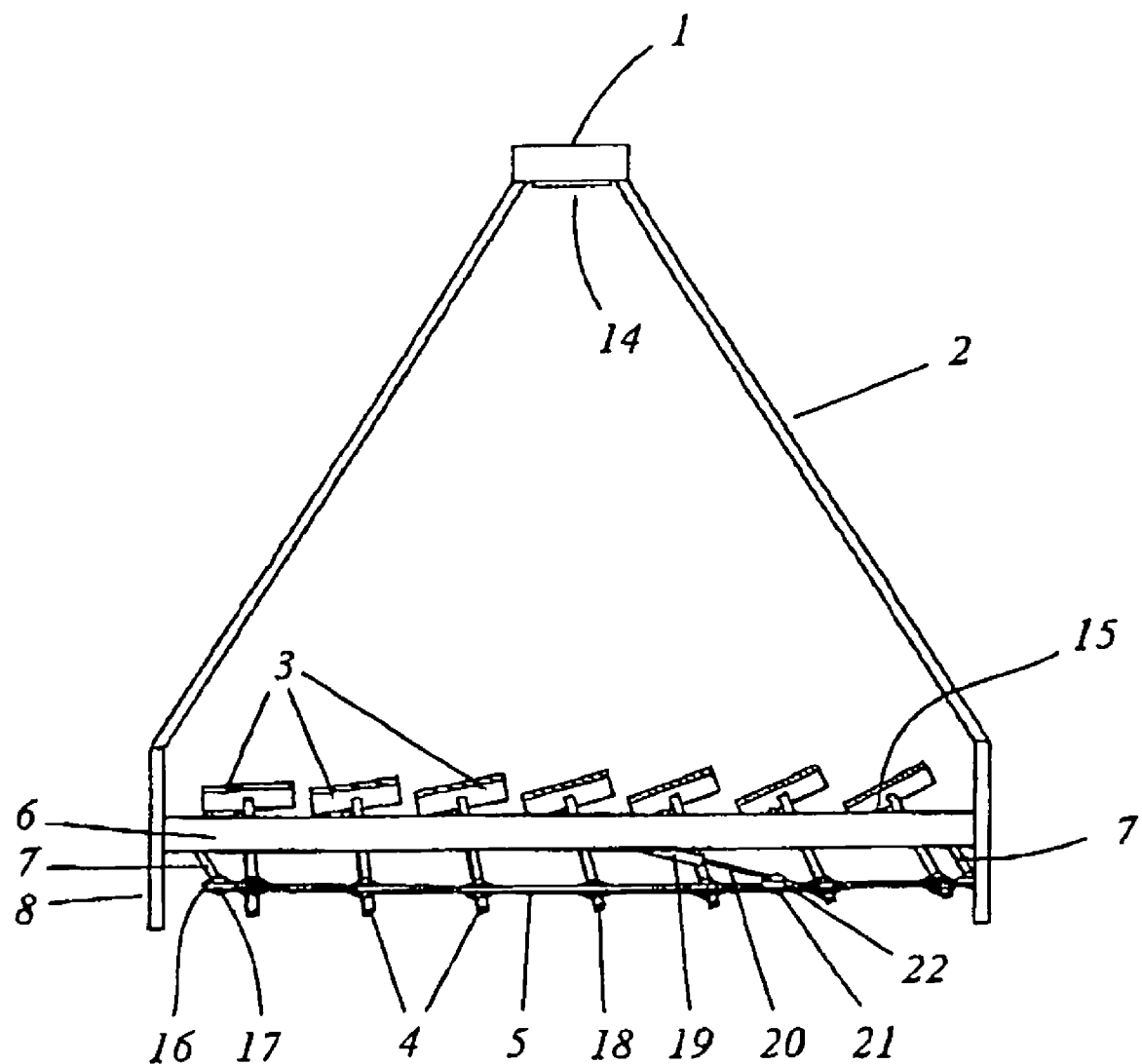
FIG. 4 is a side view of the heliostat, in accordance with the preferred embodiment.

Illustrated in FIG. 4 is a side view of the heliostat array. Each of the plurality of mirrors is oriented so as to bisect the interior angle between an incident ray I and reflected ray R directed to receiver 14. To account for diurnal movement of the source as well as seasonal changes in the declination of the sun, the heliostat is adapted to continuously track movement of the source and alter the position of the positioning plate 5 accordingly. The positioning plate 5 is positioned using at least one, preferably two, actuators that drive the positioning plate 5 to swing relative to the chassis about one, preferably two, orthogonal axes. Each of the one or more actuators (not shown), which may include a servo or stepper motor, for example, are operably coupled to the positioning plate 5 by means of a frame actuator arm 19, a positioning plate actuator arm 20, and an articulated joint including joint ball 21 and ball socket 22.

Figure 5A:
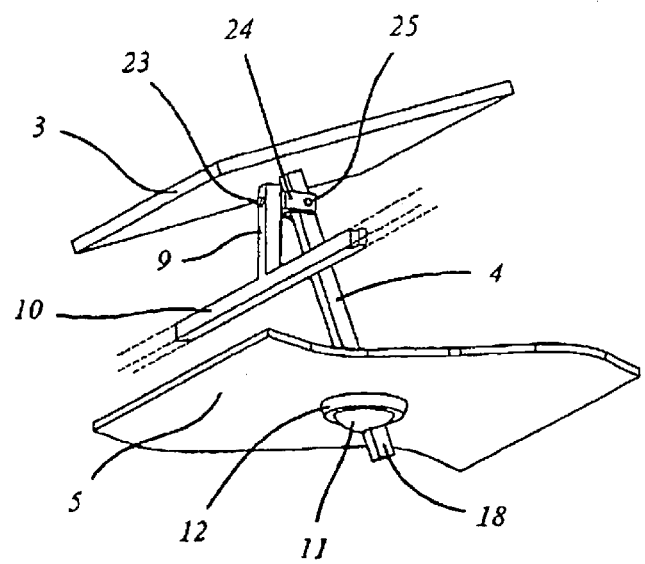
FIG. 5a is a diagrammatical illustration of a siderostats from the underside of the positioning plate, in accordance with the preferred embodiment.
Figure 5B:
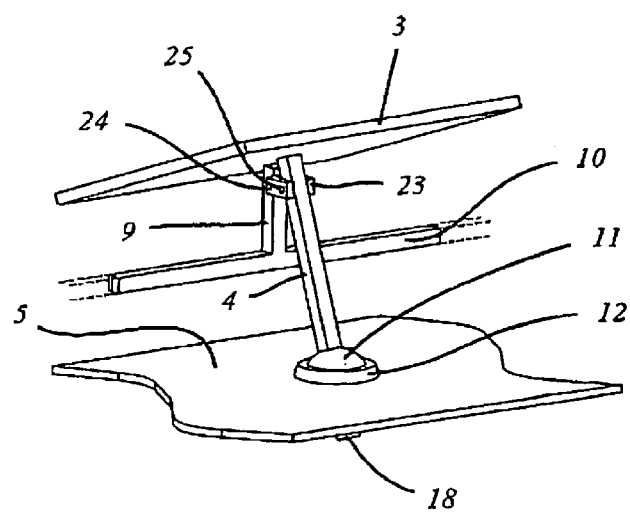
FIG. 5b is a diagrammatical illustration of a siderostats from the topside of the positioning plate, in accordance with the preferred embodiment.

Illustrated in FIGS. 5a-5b is an individual siderostat operably coupled to the heliostat chassis and positioning plate 5. The siderostat is operably coupled to the chassis, namely the stantion 9, using a primary articulated joint that permits compound rotation about two orthogonal axes that intersect at the primary center of rotation, which was schematically illustrated by point A in FIGS. 2-3. The primary articulated joint in the preferred embodiment is a universal joint although a ball joint may also be employed. An articulated joint may include a yolk 24 that permits the mirror 3 and integral position arm 4 to rotate up and down about the yoke pin 25 and rotate about the spindle 23.

The siderostat is also operably coupled to the positioning plate 5 using a secondary articulated joint, preferably a ball joint, for example, including a joint ball 11 and ball socket 12. Due to the fact that distances between each mirror 3 and the positioning plate 5 generally vary as the orientation of the mirrors is changed, the joint ball 11 is adapted to slidably engage the positioning arm 4, thereby allowing the positioning plate 5 to swing up towards or down away from the mirror 3. For example, the ball joint 11 of the secondary articulated joint may include a bore adapted to receive the distal end 18 of the positioning rod 4.

Although the effective length of the positioning arm 4 represented by the segment AC may be varied by slidably engaging the positioning plate 5, the distal end of the positioning arm 4 in other embodiments may be fixedly and rotatably attached to the positioning plate 5 using a positioning arm made of a concentric slidable sleeve and cylinder having an overall length adapted to be adjusted telescopically. In some other embodiments, one end of the positioning arm 4, the end in proximity to the mirror 3, may be adapted to slide through the primary articulated joint at point A while the opposite end is fixedly attached to the positioning plate 5 at the second articulated joint coinciding with point C.

Figure 6:
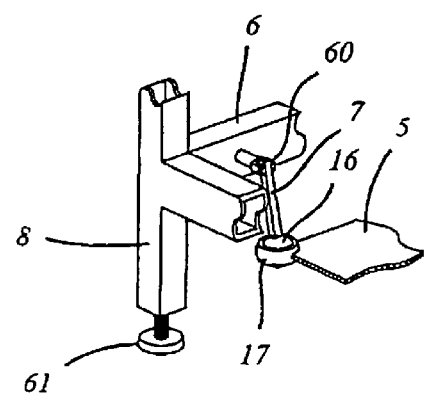
FIG. 6 is a diagrammatical illustration of the linkage coupling the positioning plate to the heliostat chassis, in accordance with the preferred embodiment.

Illustrated in FIG. 6 is a linkage coupling the positioning plate 5 to the heliostat chassis 6. The linkage in the preferred embodiment includes a swing arm 7 with articulated joints on either end. The articulated joint between the swing arm 7 and the heliostat chassis includes a universal joint 60 while the articulated joint coupled to the positioning plate 5 includes ball joint having a ball 16 and a socket 17. In accordance with the preferred embodiment, the linkage causes the position plate 5 to maintain a substantially horizontal orientation while confining the movement of the plate to trace the surface of a sphere around point D. In the preferred embodiment, the frame is supported by adjustable leveling feet 61 through an adjustment screw 62.

Figure 7:
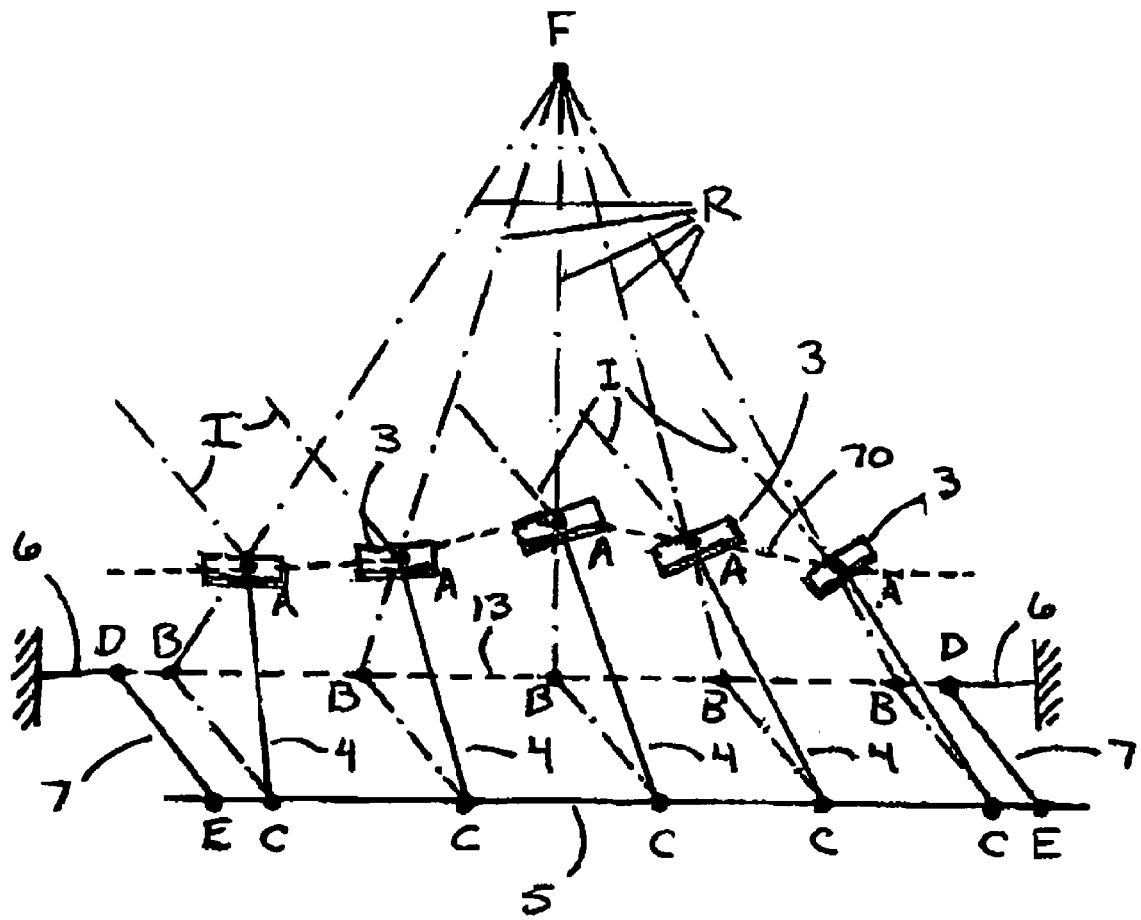
FIG. 7 is a schematic illustration of the heliostat, in accordance with one embodiment.

Illustrated in FIG. 7 is a schematic view of another embodiment of the heliostat array in which the locations of the centers of rotation of the mirror positioning arms 4 relative to the positioning plate 5, schematically represented by points C, all lie in a common plane. The center of rotation of each mirror 3, schematically represented by points A, is interposed between the focal point and the positioning plate 5 at a distance given by the vectoral sum of a first vector and a second vector having the same magnitude. The first vector points from a point B to the mirror's center of rotation while the second vector points from center of rotation of the positioning arm 4 at the positioning plate 5 to an associated point B. In this embodiment, locus of all points B also form plane. For every such point C, points A lie on a surface formed by the Conchoid of Nicomedes surface of revolution. As one of ordinary skill will appreciate, since the centers of rotation of the mirrors 3 lie on the Conchoid of Nicomedes surface of revolution, so do the points B and points C; the particular Conchoid of Nicomedes surfaces of revolution being simple planes. The positioning plate 5 in this embodiment may be a rigid frame or a wire mesh in which the wires are held in tension around the periphery of the heliostat array.

Figure 8:
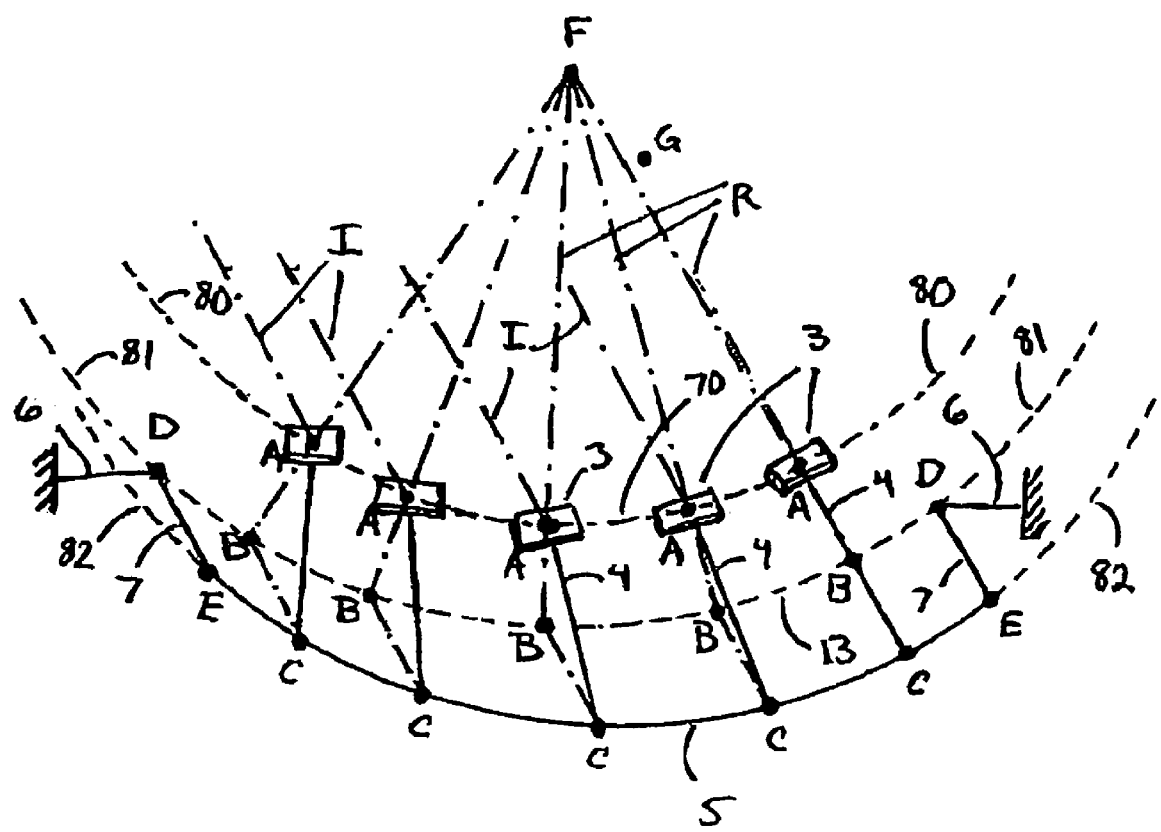
FIG. 8 is a schematic illustration of the heliostat, in accordance with one embodiment.

Illustrated in FIG. 8 is a schematic view of another embodiment of the heliostat array wherein the location of points A, i.e., the centers of rotation of each mirror 3, are distributed in the form of a sphere centered at the focal point, F, with a radius equal to the length of the segments AF, schematically represented by the surface 80. The corresponding positioning plate 5 includes the points C as well as points E. Each of the points C schematically represents one of the centers of rotation of the positioning arms 4 while points E schematically represent a pair of second hinges operatively coupling the positioning plate 5 to a pair of swing arms 7. As described above, the center of rotation of each mirror 3 is interposed between the focal point and the positioning plate 5 at a distance given by the vectoral sum of a first vector and a second vector having the same magnitude. As also described above, the first vector points from a point B to the mirror's center of rotation while the second vector points from center of rotation of the positioning arm 4 at the positioning plate to an associated point B.

In this embodiment, the points B all lie on the sphere centered at F, with a radius equal to the length of the segments BF, schematically represented by the spherical surface 81. Sphere 81 is concentric with sphere 80. Because A, B and F are collinear with A lying on the segment BF, the radius of 81 is equal to the sum of the lengths of segments AB and AF. In this embodiment, the mirror positioning plate 5 is shaped such that the points C lie on a sphere having a center at point G and a radius equal to the length of the segments CG, the sphere being schematically represented by the surface 82. As the positioning plate 5 is displaced in accordance with the swing arms 7, the point G is confined to rotate about the focal point in a sphere having a radius given by the length of the segment FG which is equal in magnitude to the segments AB, BC, and DE. The segment FG is substantially parallel to rays I and to the segments BC and DE.

As one skilled in the art will appreciate, the sphere 81 is equal in radius to sphere 82. As above, plate 5 is rotatably coupled to points E by links 7 which are rotatably coupled to points D which are fixed relative to points A and F. One skilled in the art will appreciate that points D and E need not lie on surface 81 and surface 82 and may be displace by parallel translation as long as point E is rigidly and mechanically coupled to plate 5.

Figure 9:
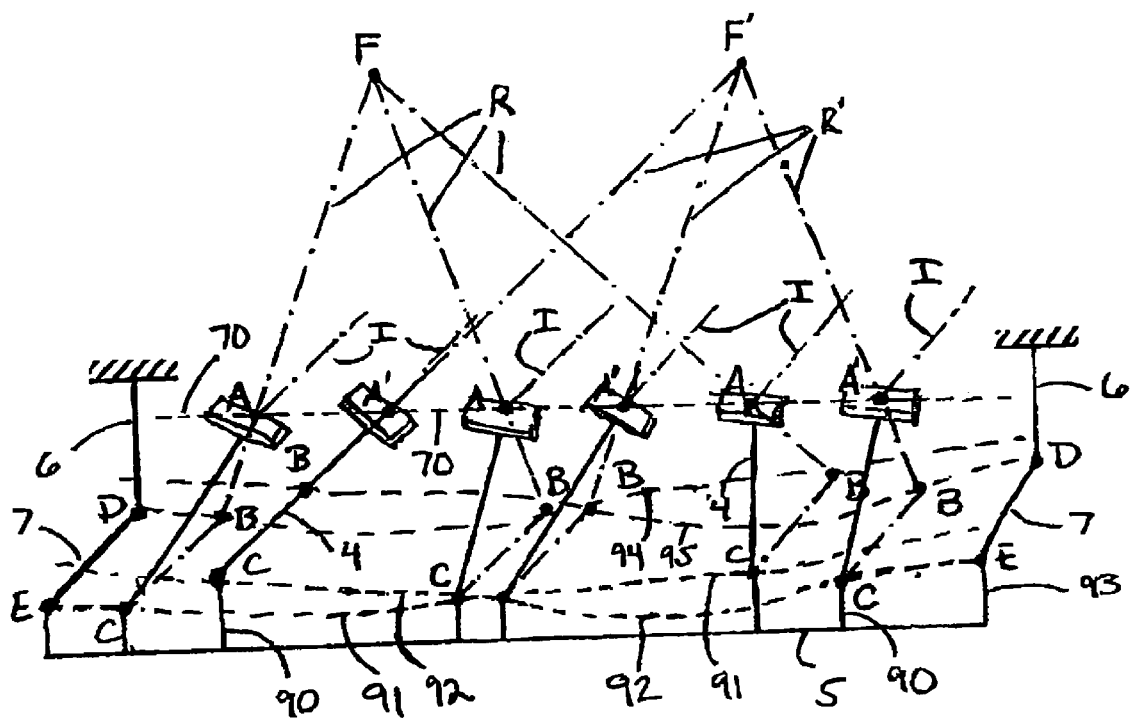
FIG. 9 is a schematic illustration of the heliostat, in accordance with one embodiment.

Illustrated in FIG. 9 is a schematic view of another embodiment of the heliostat array in which the plurality of mirrors 3 has a different focal point F. In this embodiment, the plurality of focal points include a first focal point and a second focal point indicated by points F and F', respectively. The rays I incident on a first set of one or more of the mirrors 3, for example, are directed as rays R to point F while rays I incident on a second set of one or more of the mirrors 3 are directed as rays R' to point F'. In the example embodiment illustrated in FIG. 9, individual mirrors focus to point F and the mirrors focused to point F' are interleaved, yet are still operatively coupled to the same positioning plate 5 via rigid connections 90 that project at a right angle to the plate 5 in this embodiment. The position plate 5 is adapted to incorporate the centers of rotation C about which the distal end of each of the positioning arms 4 rotate using the rigid connection 90. The locus of points C, such that the corresponding mirror 3 attached to C through arms 4 direct rays at F, is schematically represented by the surface 91. Similarly, the locus of points C, such that the corresponding mirror 3 attached to C through arms 4 direct rays at F', is schematically represented by the surface 92. The special case that the points A share a common locus 70, for each point F and F' there is a corresponding locus of points B schematically represented here as 94 and 95 respectively.

In the special case that the locus of points 70 forms a plane, the shape of a first surface including surface 91 and surface 94 forms a Conchoid of Nicomedes surface of revolution having an axis of rotation including the point F that is perpendicular to 70. Similarly, a second surface including surfaces 92 and 95 forms a Conchoid of Nicomedes surface of revolution having an axis of rotation including the point F' that is perpendicular to 70.

One skilled in the art will appreciate that using this embodiment as an example, each point A coinciding with the centers of rotation of the mirrors may have a distinct point F which is programmed or encoded into the positioning plate 5 by adjusting the position of point C relative to an associated point A in the manner described above. In other embodiments, the plurality of mirrors may be used to redirect light in multiple directions toward points $F_i$ for each point $A_i$ where $F_i$ is substantially fixed relative to $F_i$ and where i is an index over the plurality of points $A_i$ with only one rigid positioning plate 5 actuated with as few as one or two actuators.

One of ordinary skill in the art will recognize that multiple foci allow a single unit to possess sets of mirrors that shadow less of incident rays I and therefore more densely packed mirrors. Embodiments similar to this allow for separate units to be linked together using one or two actuators for multiple foci.

Figure 10:
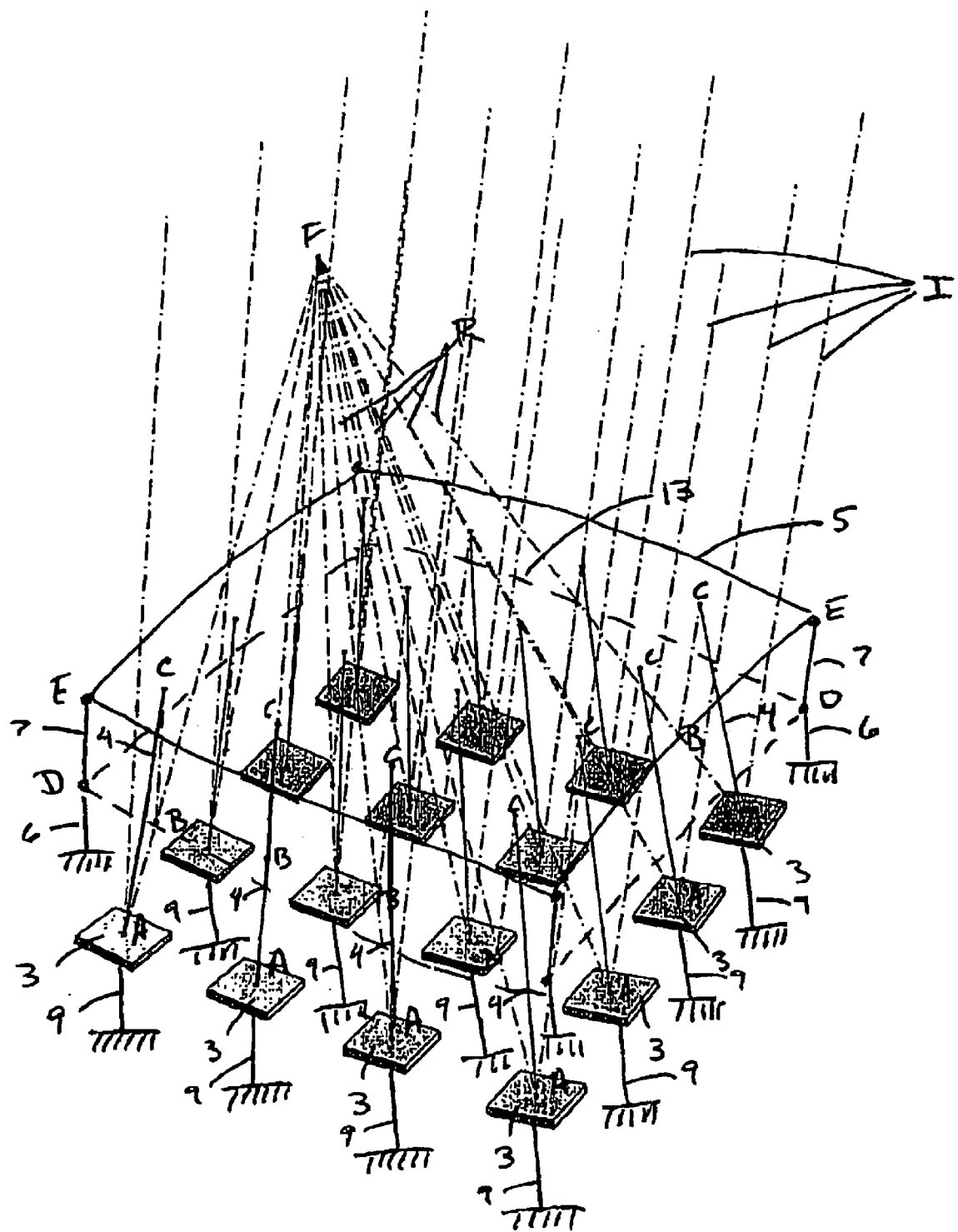
FIG. 10 is a schematic illustration of the heliostat, in accordance with one embodiment.

Illustrated in FIG. 10 is a schematic view of an embodiment of the heliostat array in which the mirror positioning plate 5 is interposed between the focal point F and the mirror rotation centers A. In this embodiment, the points C—corresponding to the centers of rotation of the distal ends of positioning arms 4—are positioned by plate 5 where they are interposed between points A and the focus F such that points B lie on the line segments AF. In this embodiment, positioning arms 4 extending perpendicularly from the reflective side of the mirrors 3 rotatably engage the rigid positioning plate 5 above the mirrors, about points C. As described above, for the special case that the points A lie on a plane, the points B lie on a Conchoid of Nicomedes surface of revolution. Similarly if the points B lie on a plane than the points A lie on Conchoid of Nicomedes surface of revolution in each case generated by the focal point F.

The positioning plate 5 in this configuration is adapted to minimize the obstruction of incident energy so as to permit the incident rays I and redirected rays R to pass relatively unimpeded from both the distant radiation source and to the focus F. In the preferred embodiment, the positioning plate 5 is constructed from a substantially transparent material, formed with holes, or made of a mesh-like material, for example. One skilled in the art will recognize that this can be achieved with a mesh or a grid that can engage 4 such that it passes through point C. The length of segments AC must again be allowed change such that each triangle ABC is isosceles with segment AC as the base. In this embodiment positioning plate 5 is rotatably coupled to a foundational support 6 by means of rigid swing arms 7 having hinges schematically represented by points E and points D. The hinges at points D are fixedly attached to the foundation 6 relative to points A and point F. As with the preferred embodiment, segments ED are parallel to segments AB, which are in turn parallel to rays I.

Although the first and second embodiments described above include a plurality of mirrors arrayed in a plane, one of ordinary skill in the art will appreciate that the mirrors may also be arrayed in three dimensions provided appropriate adjustment is made to the positioning plate. In particular, the position plate is adapted to incorporate the centers of rotation about which the distal end of each of the positioning arms rotates wherein the distant between the center of rotation of each mirror and the distal end of the positioning arm is substantially equal to the vector sum of the receiver unit vector and the source unit vector as described above.

In some embodiments, the solar concentrator is adapted to be mounted on a commercial or residential roof in a manner that secures the concentrator to the roof without breaching the integrity of the roof. In contrast to the prior art, the present concentrator frictionally attaches to the roof, thereby enabling the concentrator to detachably attach to the roof without employing fasteners that penetrate the roof. The absence of roof penetrations significantly reduces the probability of damage to the roof or water ingress.

In some preferred embodiments, the frame of the solar energy concentrator is made to frictionally adhere to a roof using a plurality of footings that distribute the weight of the concentrator and increase the friction inhibiting the concentrator from sliding across the roof under the force of gravity or wind loading or combinations thereof. As illustrated in FIGS. 11A-11C, the heliostat chassis includes a plurality of frame support feet 8, each foot 8 being detachably affixed to a footing that directly engages the roof. In a first embodiment of the footing, the footing includes a hollow container 1100 adapted to receive ballast and means to detachably engage the container 1100 to the leg 8. The hollow footing includes a bayonet fitting or threaded mouth 1104 and cap 1105, for example, adapted to receive ballast 1120—preferably water, sand, or gravel—retained within a reservoir therein. As illustrated in the cross section of the hollow footing in FIG. 11C, the means to detachably engage the leg 8 includes a post 1102 fixedly attached to the container 1100. The smaller-diameter post 1102 slidably engages the larger-diameter leg 8 until pins 1108A, 1108B outwardly biased by spring 1109 engage corresponding holes 1110 in the leg 8. To detach the footing, the user merely applies pressure to the two pins 1108A, 1108B while lifting the chassis. The footing may also be moved conveniently using the handle 1112 embedded in the container 1100 before of after emptying its contents.

In some embodiments, the walls 1130 of the footings outer facing surfaces are inclined to mitigate the force of wind or to induce downward pressure on the footings for purposes of increasing static friction while spreading the point loads into a larger surface, thus preventing roof damage or deformation. In still other embodiments, the footing includes a rubber pad or other material with a high coefficient of static friction to further enhance the ability of the concentrator to resist lateral movement. In still other embodiments, the footing may be indirectly to the roof by means of an adhesive, epoxy, mastic, tar, or like bonding agent. Depending on the weight of the concentrator, the underside of the footings may be designed with a footprint large enough to reduce the overall average roof loading to less than 4 pounds per square foot and the point loading associated with the footing to less than 34 pounds per square foot.

As illustrated in FIGS. 12A and 12B, a second embodiment of a concentrator footing includes a subassembly as a means to detachably engage the leg 8 and solid ballast. The exemplary subassembly includes a post 1204 that slidably engages the leg and a bottom plate 1208 for bearing the weight of the sold ballast 1202. As described above, the post detachably engages heliostat leg 8 by means of pins 1206A, 1206B outwardly biased by a spring 1206C. The ballast may be concrete although various other materials, preferably durable and having a relatively high density may also be employed.

Illustrated in FIGS. 13A and 13B is a third embodiment of a concentrator footing. Each of the one or more footings 1300 is a receptacle including a cavity adapted to receive ballast such as an 8 inch cinder block 1310, for example. The footings 1300 are attached to the concentrator by means of fasteners, e.g., bolts, that engage the mounting plate 1308 Movement of the concentrator is inhibited by the cinder block which enhanced the weight and static friction of the via the inner wall 1304 and bottom plate 1306 made of rigid material. Preferably, the outer wall 1302 is inclined to mitigate the force of wind or to induce downward pressure on the footings for purposes of increasing static friction with the underlying roof.

Illustrated in FIGS. 14A and 14B is a fourth embodiment of a concentrator footing. The multiple sections of footing 1400 are adapted to wrap around or otherwise border substantially the entire perimeter of the array of mirror schematically represented therein. The section of footing includes a channel 1404 adapted to receive a support frame 6 and a cavity 1402 to receive ballast, preferably one or more sandbags 1410 removably concealed therein. Preferably, the outer wall 1406 of the footing is sloped to mitigate the lateral force of the wind 1420 and induce a downward force on the concentrator.

As illustrated in FIG. 15, the concentrator in some embodiments is a concentrator module adapted to physically and operably couple to one or more other concentrator modules. In this example, the concentrator modules 1504 are assembled edgewise in an m by n matrix, each module 1504 having an environmental covering 1502 and each concentrator module 1504 made to focus light on its respective receiver 1506. The perimeter of the assembly of concentrators 1500 is bordered by a detachable shielding 1508 that may be used to inhibit the fluttering of the mirrors that may otherwise be caused by wind.

Figure 16A:
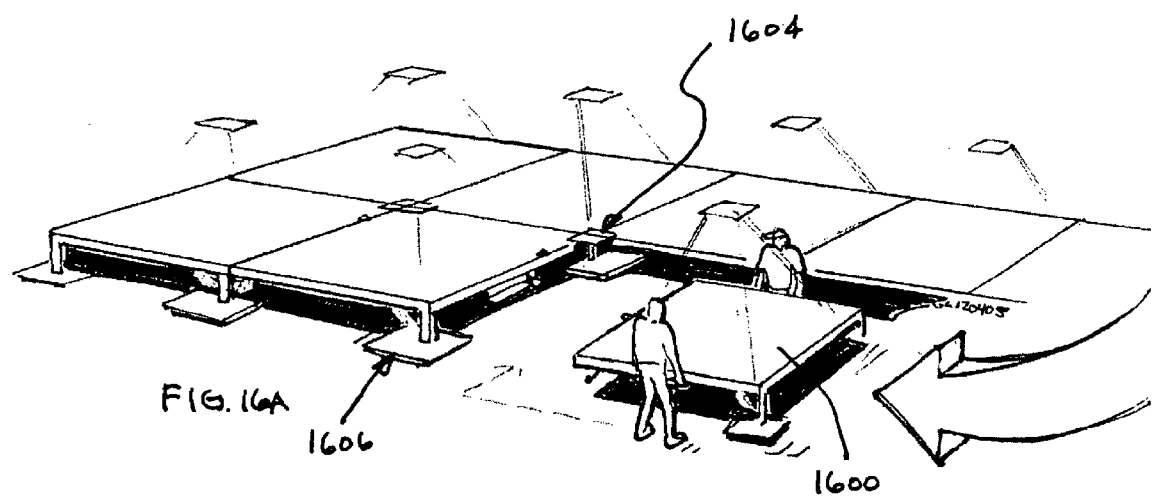
FIG. 16A is a perspective view of a plurality of concentrators being installed in a roof-mounted assembly, in accordance with the first embodiment of the assembly.
Figure 16B:
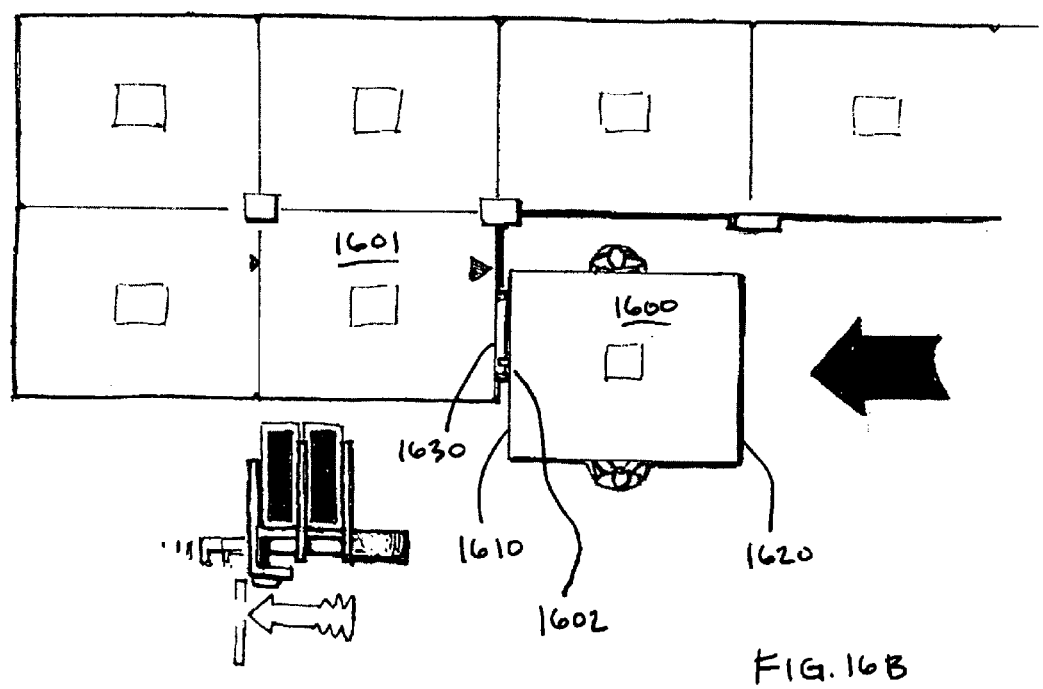
FIG. 16B is a plan view of a plurality of concentrators being installed in a roof-mounted assembly, in accordance with the first embodiment of the assembly.

Illustrated in FIGS. 16A and 16B is a perspective view and a plan view, respectively, of an assembly of concentrators under construction. A concentrator 1600 in the preferred embodiment is integrated into the assembly using one or more mechanical couplings including a positioning plate coupling 1602, one or more frame cap couplings 1604 described in detail below, and one or more frame foot couplings also described in detail below. Each concentrator 1600 includes a first side edge 1610 referred to herein as the head and a second side edge 1620 referred to as the tail. In the preferred embodiment, the positioning plate coupling 1602 operatively couples the positioning plate of a first concentrator 1600 at its head 1620 to the positioning plate of a second concentrator 1601 at its tail 1630.

Illustrated in FIGS. 17A and 17B are two views of an exemplary positioning plate coupling 1602 that includes a first member 1702 fixed to the head of the first concentrator 1600 and a second member 1710 fixed to the tail of the second concentrator 1600. The first member 1702 includes a bracket 1704 that is pivotally attached to the associated frame 6 at hinge 1708 and rigidly attached to the associated positioning plate (not shown). The first member 1702 further includes a pin 1705 with a protrusion 1706 referred to herein as a key. The second member 1710 includes a rail 1712 with a recess 1714 and a slot or angled channel 1716. During integration of the first concentrator 1600 to the second concentrator 1600, an exemplary assembly process has the first concentrator 1600 lowered so as to cause the pin 1705 to engage the rail 1710. Thereafter the head of the first concentrator 1600 is slide horizontally (into the page of FIG. 17B) until the pin engages the recess 1714, after which the first concentrator 1600 is pushed in the direction of the second concentrator 1601 to drive the pin into the corresponding channel 1761. As the pin then locks into the channel after descending through the vertical portion and laterally in the horizontal section since the second member 1710 is captured between the key 1706 and the bracket 1704. Once locked, the positioning plates of the first concentrator 1600 second concentrator 1600 are made to move in unison. In the preferred embodiment, the coupling of the two positioning plates is achieved without tools and actually locking confirmed by an audible "click" sound.

Illustrated in FIGS. 18A and 18B is a plurality of frame cap couplings 1802-1804 adapted to detachably attach a plurality of concentrators 1820, 1821, 1822 at the corners of their frames. As illustrated, a frame cap coupling 1802—physically coupling three concentrators 1820-1822 together—includes a top plate 1804 and two or more extensions 1806 adapted to slidably engage corresponding recesses 1808 at the corners of the heliostat frame 8. Each of the two or more extensions 1806, preferably three, includes a fastener with one or more pins 1810 biased outwardly by a spring (not shown) into the holes 1812 in the frame 8.

Figures 19A, 19B:
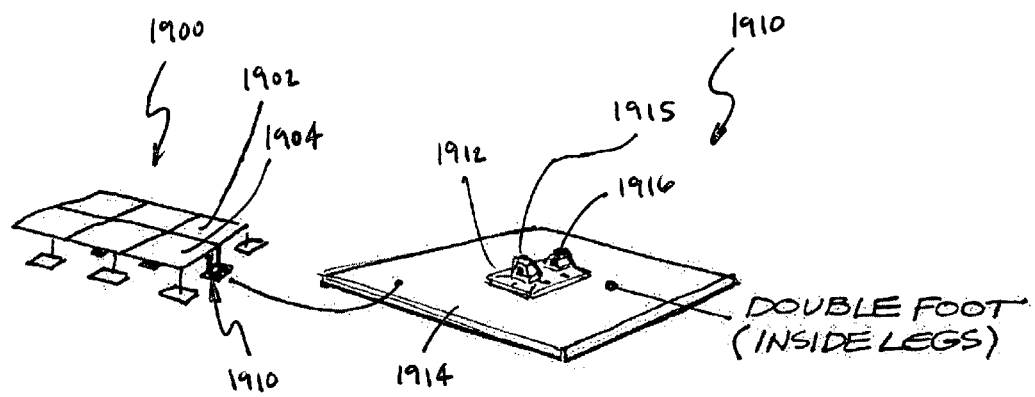
FIGS. 19A and 19E are a footing for frictionally affixing the heliostat to a roof, in accordance with a fifth embodiment of the footing.
Figures 19C, 19D:
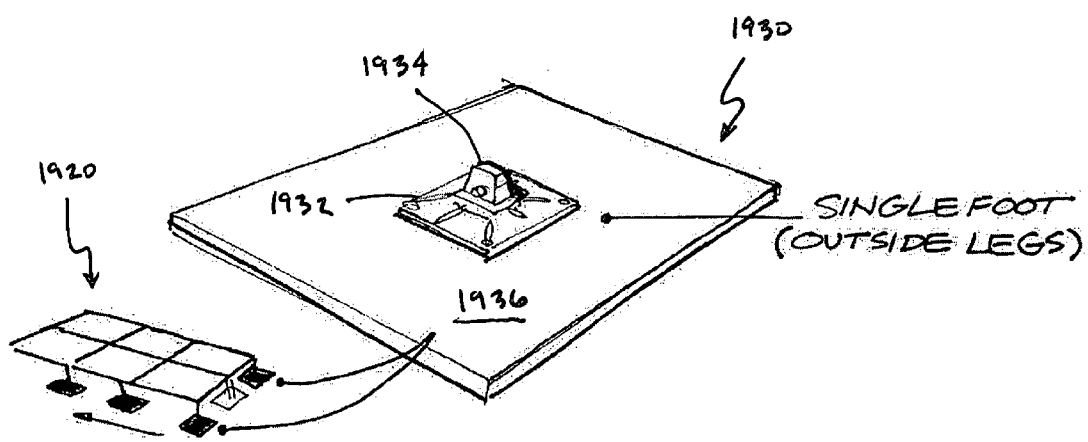
Figures 19G, 19H:
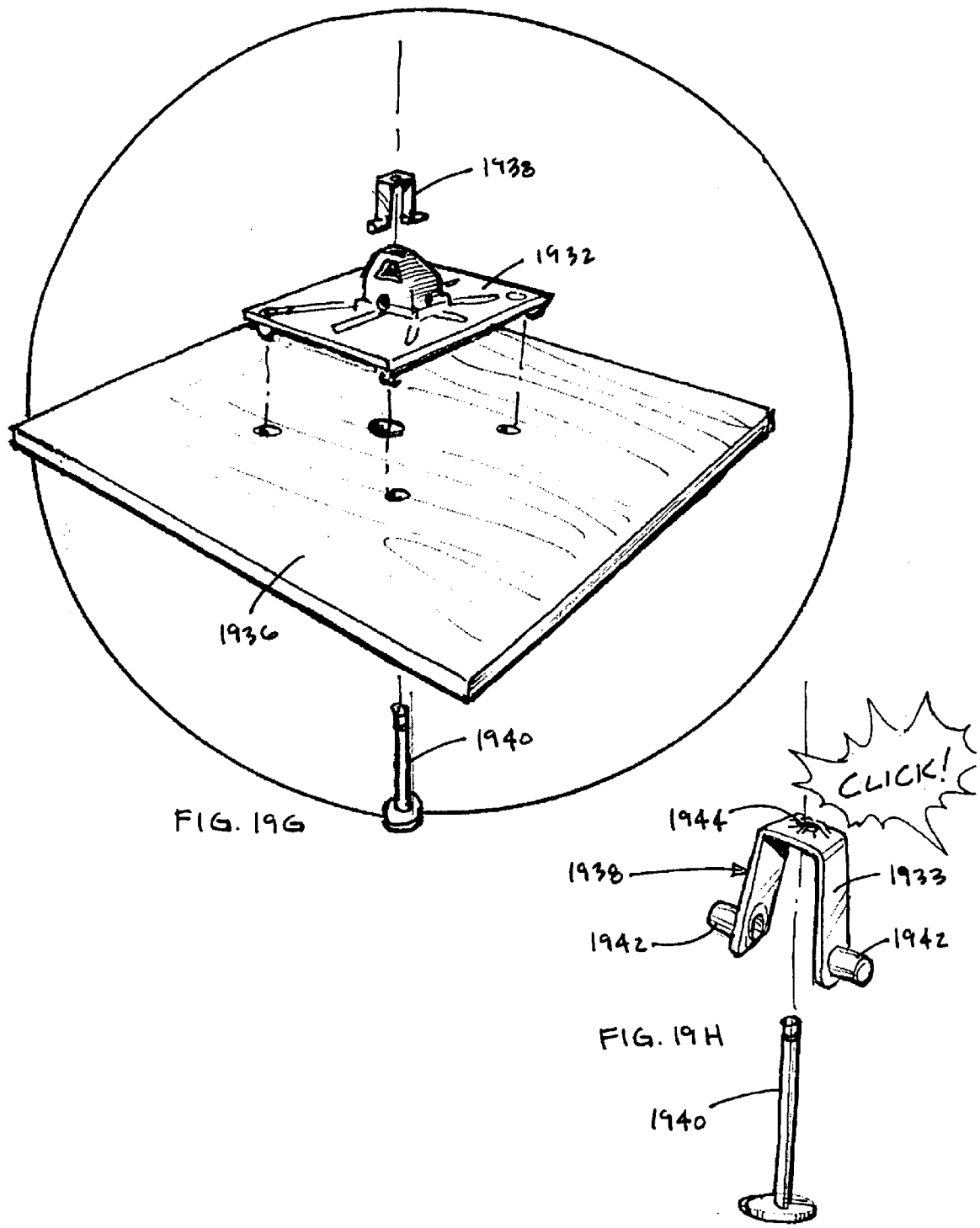

Illustrated in FIGS. 19A and 19B is an exemplary frame foot coupling 1910 in an concentrator assembly 1900. The frame foot coupling 1910, also referred to as the "double foot," provides a common footing for two adjacent heliostat concentrators 1902, 1904. The frame foot coupling 1910 includes rigid upper plate 1912 and lower plate 1914. The upper plate 1912 includes a first protrusion 1915 adapted to receive a leg of a first concentrator 1902 as well as a second protrusion 1916 adapted to receive a leg of a second concentrator 1904. The weight of the two concentrators 1902, 1904 is transferred from the upper plate 1912 to the lower plate 1914 having a surface area large enough to distribute the load and frictionally attached to a roof.

Illustrated in FIGS. 19C through 19H is a fifth embodiment of a concentrator footing 1930. The footing 1930, also referred to a "single foot" herein, is adapted to support a leg of a concentrator at the periphery of the assembly of concentrators 1920. An upper plate 1932 includes a protrusion 1934 adapted to receive a leg of a concentrator and detachably lock to the leg by means of a fastener 1938 including one or more pins 1942 outwardly biased by the spring element 1433 therebetween. The lower plate 1914 is captured between the head of an elongated fastener 1940 and the upper plate when the distal end of the elongated fastener engages a hole 1944 in the fastener 1938.

Figure 20:
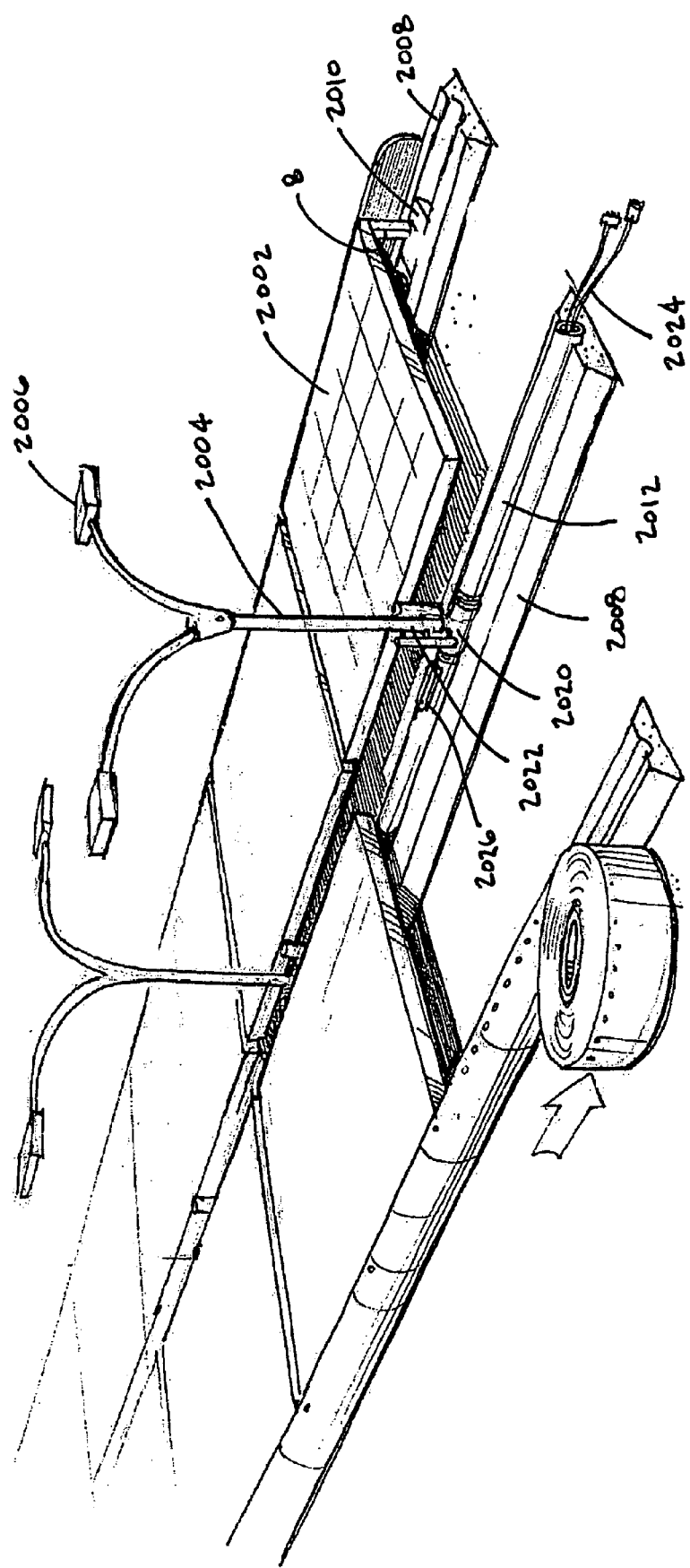
FIG. 20 is a perspective view of a plurality of concentrators in a roof-mounted assembly, in accordance with a second embodiment of the assembly.

Illustrated in FIG. 20 is another embodiment of the assembly of concentrators 2000. Each of the concentrators includes an array of mirrors schematically represented by grid 2002 and a corresponding receiver 2006. In this embodiment, a common pole 2004 supports a plurality of receivers 2006. The power and control cabling 2024 running between poles is housed within a conduit 2012 and T-coupling 2020 recessed within a trough 2008 running the length of the assembly of concentrators. Additional access to the cabling 2024 within the conduit 2012 is made possible by removal of an access cover 2026 installed at regular intervals along the length of the conduit. A trough 2008 may also be used to support and distribute the weight of a heliostat chassis 8 via leg mounts 2010 that lie within a trough 2008.

DEFINITION OF LABELED COMPONENTS

1. Receiver housing
2. Receiver support arms
3. Reflectors or mirrors
4. Mirror positioning arms
5. Rigid mirror positioning plate
6. Mirror support frame
7. Positioning plate swing arm
8. frame support feet
9. Mirror stantions
10. Supports
11. Ball joint and slide ball
12. Ball joint socket
13. Virtual mirror positioning plate (Locus of points B)
14. Receiver
15. Mirror universal joint
16. Positioning plate link arm ball joint socket
17. Positioning plate link arm ball joint ball
18. Mirror positioning sticks 19. Frame actuator arm
20. Positioning plate actuator arm
21. Actuator ball joint ball
22. Actuator ball joint socket
23. Spindle
24. Yoke
25. Yoke pin
60. Swing arm universal joint
61. Adjustable leveling foot
70. Locus of points A
80. Sphere of radius AF centered at F
81. Sphere of radius BF centered at F
82. Sphere of radius CG centered at G
90. Rigid connection of the distal end of positioning arm to positioning plate point C
91. Locus of points C that redirect rays R to point F
92. Locus of points C that redirect rays R to point F'
93. Rigid connection or swing arm joining a point E to a mirror 5
1100 container footing
1102 footing post
1104 mouth
1105 cap
1108A-B fastener pins
1109 spring
1110 fastener holes
1112 handle
1120 ballast
1130 outer facing wall
1200 solid ballast footing
1202 solid ballast
1204 footing post
1206A,-B fastener pins
1206C spring
1208 bottom plate
1300 footing
1302 outer wall
1304 inner wall
1306 bottom plate
1308 mounting plate
1310 cinder block
1400 peripheral footing
1402 cavity
1404 channel
1410 sandbag
1420 wind
1500 assembly of concentrators
1502 environmental covering
1504 concentrator module
1506 receiver
1508 detachable shielding
1600 first concentrator
1601 second concentrator
1602 positioning plate coupling
1604 frame cap couplings
1606 footing
1610 first side edge
1620 head of first concentrator
1630 tail of second concentrator
1702 first member
1704 bracket
1705 pin
1706 key
1708 hinge
1710 second member
1712 rail
1714 recess
1716 angled channel
1802 first frame cap coupling
1803 second frame cap coupling
1804 third frame cap coupling
1806 extension
1808 recesses
1812 fastener holes
1820 first concentrator
1821 second concentrator
1822 third concentrator
1900 concentrator assembly
1902 first concentrators
1904 second concentrator
1910 frame foot coupling or double foot
1912 rigid upper plate
1914 lower plate
1915 first protrusion
1916 second protrusion
1920 concentrator assembly
1930 single foot
1932 upper plate
1933 spring
1934 protrusion
1936 lower plate
1938 fastener
1940 elongated fastener
1942 fastener pin
1944 hole
2000 assembly of concentrators
2002 array of mirrors
2004 common pole
2006 receiver
2008 trough
2010 leg mounts
2012 conduit
2020 T-coupling
2022 concentrator mounting fixture
2024 cabling
2026 access cover Although the description above contains many specifications, these should not be construed as limiting the scope of the invention but as merely providing illustrations of some of the presently preferred embodiments of this invention.

Therefore, the invention has been disclosed by way of example and not limitation, and reference should be made to the following claims to determine the scope of the present invention.

We claim:

1. A solar energy concentrator comprising:
a receiver configured to receive energy from a solar energy source;
one or more reflectors comprising an array of mirrors adapted to direct solar energy to the receiver, each mirror of the array of mirrors adapted to rotate about a first center of rotation;
a frame affixed to the receiver and one or more reflectors, the frame comprising a plurality of footings adapted to frictionally affix the frame to a roof surface without penetrating the roof surface, wherein said concentrator is adapted to be detachably secured to the roof while concurrently maintaining the integrity of the roof, wherein the one or more reflectors are interposed between a positioning plate and the receiver; and
a plurality of reflector positioning arms for operably coupling the array of mirrors to the positioning plate, wherein each of the positioning arms is adapted to rotate relative to the positioning plate about a second center of rotation, the positioning plate adapted to simultaneously aim each of the array of mirrors in a direction substantially bisecting an interior angle between the solar energy source and the receiver, wherein a line segment between the first center of rotation and the second center of rotation for each of the plurality of positioning arms is substantially equal to a base of an isosceles triangle having a first leg aligned with a first ray from the source and the a second leg parallel to a second ray to the receiver, wherein the first leg and second leg are equal length.

2. The concentrator of claim 1, wherein the receiver is a photovoltaic cell.

3. The concentrator of claim 1, wherein the positioning plate is a rigid positioning plate.

4. The concentrator of claim 1, wherein the array further comprises at least one linkage rotatably coupling the positioning plate to the one or more reflectors.

5. The concentrator of claim 4, wherein the at least one linkage comprises a swing arm rotatably coupling the positioning plate to the one or more reflectors, wherein a length of the swing arm is substantially equal to the magnitude of the second unit vector.

6. The concentrator of claim 1, wherein the one or more reflectors comprise a plurality of reflectors arrayed in a common plane, and the second center of rotation for the plurality of positioning arms are distributed in accordance with a Conchoid of Nicomedes surface of revolution.

7. The concentrator of claim 1, wherein one or more of the plurality of footings comprises a hollow container adapted to receive and retain a ballast.

8. The concentrator of claim 7, wherein the ballast is selected from the group consisting of: water, sand, and gravel.

9. The concentrator of claim 7, wherein the container comprises one or more surfaces adapted to induce a downward force on the concentrator in the presence of wind.

10. The concentrator of claim 1, wherein one or more of the plurality of footings comprises a receptacle having a cavity adapted to removably receive and retain a ballast adapted increase static friction between the one or more footings and the roof.

11. The concentrator of claim 10, wherein the ballast comprises one or more surfaces adapted to induce a downward force on the concentrator in the presence of wind.

12. The concentrator of claim 11, wherein the one or more of the plurality of footings further comprises a post and bottom plate adapted to retain the ballast.

13. The concentrator of claim 11, wherein the ballast comprises one or more surfaces adapted to induce a downward force on the concentrator in the presence of wind.

14. The concentrator of claim 11, wherein the receptacle comprises one or more outer facing surfaces adapted to induce a downward force on the concentrator in the presence of wind.

15. A solar energy concentrator comprising:
a receiver configured to receive energy from a solar energy source;
an array of mirrors arrayed in a common plane and adapted to direct solar energy to the receiver, each mirror of the array of mirrors is adapted to rotate about a first center of rotation;
a frame affixed to the receiver and the array of mirrors, the frame comprising a plurality of footings adapted to frictional affix the frame to a roof surface without penetrating the roof surface, wherein said concentrator is adapted to be detachably secured to the roof while concurrently maintaining the integrity of the roof, wherein the array of mirrors is interposed between a positioning plate and the receiver; and
a plurality of reflector positioning arms for operably coupling the mirrors to the positioning plate, wherein each of the positioning arms is adapted to rotate relative to the positioning plate about a second center of rotation, the positioning plate adapted to simultaneously aim each of the array of mirrors in a direction substantially bisecting an interior angle between the source and the receiver,
wherein a line segment between the first center of rotation and the second center of rotation for each of the plurality of positioning arms is substantially equal to a base of an isosceles triangle having a first leg aligned with a first ray from the source and the a second leg parallel to a second ray to the receiver, wherein the first leg and second leg are equal length.

16. The concentrator of claim 15, wherein the receiver is a photovoltaic cell.

17. The concentrator of claim 15, wherein the array further comprises at least one linkage rotatably coupling the positioning plate to the mirrors.

18. The concentrator of claim 17, wherein the at least one linkage comprises a swing arm rotatably coupling the positioning plate to the array of mirrors, wherein a length of the swing arm is substantially equal to the magnitude of the second unit vector.

19. The concentrator of claim 16, wherein the second center of rotation for the plurality of positioning arms are distributed in accordance with a Conchoid of Nicomedes surface of revolution.

* * * * *